(12) United States Patent
Hayashi et al.

(10) Patent No.: US 9,806,280 B2
(45) Date of Patent: Oct. 31, 2017

(54) ORGANIC ELECTROLUMINESCENT ELEMENT HAVING A SEALING SUBSTRATE, AND METHOD FOR PRODUCING ORGANIC ELECTROLUMINESCENT ELEMENT

(71) Applicant: KONICA MINOLTA, INC., Tokyo (JP)

(72) Inventors: Kenji Hayashi, Tokyo (JP); Koutarou Kikuchi, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/125,773

(22) PCT Filed: Mar. 20, 2015

(86) PCT No.: PCT/JP2015/058483
§ 371 (c)(1),
(2) Date: Sep. 13, 2016

(87) PCT Pub. No.: WO2015/163061
PCT Pub. Date: Oct. 29, 2015

(65) Prior Publication Data
US 2016/0380226 A1    Dec. 29, 2016

(30) Foreign Application Priority Data

Apr. 23, 2014   (JP) ................ 2014-089021

(51) Int. Cl.
*H01L 51/50*   (2006.01)
*H01L 51/52*   (2006.01)
(Continued)

(52) U.S. Cl.
CPC ...... *H01L 51/5228* (2013.01); *H01L 51/0096* (2013.01); *H01L 51/50* (2013.01);
(Continued)

(58) Field of Classification Search
CPC ......... H01L 51/00; H01L 51/50; H01L 51/52; H01L 51/56
See application file for complete search history.

(56) References Cited

U.S. PATENT DOCUMENTS

2011/0133637 A1    6/2011  Ota
2016/0126497 A1*   5/2016  Yamada ............. H01L 51/5253
                                                    257/40

FOREIGN PATENT DOCUMENTS

JP    H10275680 A    10/1998
JP    2000348859 A   12/2000
(Continued)

OTHER PUBLICATIONS

International Search Report dated May 26, 2015 for PCT/JP2015/058483 and English translation.

*Primary Examiner* — Hoai V Pham
(74) *Attorney, Agent, or Firm* — Lucas & Mercanti, LLP

(57) ABSTRACT

Provided is an organic EL element comprising: a gas barrier layer disposed on a substrate; a light-emitting part; an inorganic sealing layer; lead-out wiring that extends outside of the inorganic sealing layer; and a sealing substrate that is bonded via a resin adhesive layer, wherein the organic EL element is configured such that above at least the lead-out wiring, the sealing substrate is folded to the substrate side and makes contact with the inorganic sealing layer, and improvement of connection reliability with external equipment is possible.

11 Claims, 14 Drawing Sheets

(51) Int. Cl.
*H01L 51/00* (2006.01)
*H01L 51/56* (2006.01)

(52) U.S. Cl.
CPC ...... *H01L 51/5212* (2013.01); *H01L 51/5243* (2013.01); *H01L 51/5253* (2013.01); *H01L 51/56* (2013.01)

(56) References Cited

FOREIGN PATENT DOCUMENTS

| | | | |
|---|---|---|---|
| JP | 2002373777 A | 12/2002 |
| JP | 2004342515 A | 12/2004 |
| JP | 2008010211 A | 1/2008 |
| JP | 2013089561 A | 5/2013 |
| JP | 2014167895 A | 9/2014 |
| WO | 2010024006 A1 | 3/2010 |

* cited by examiner

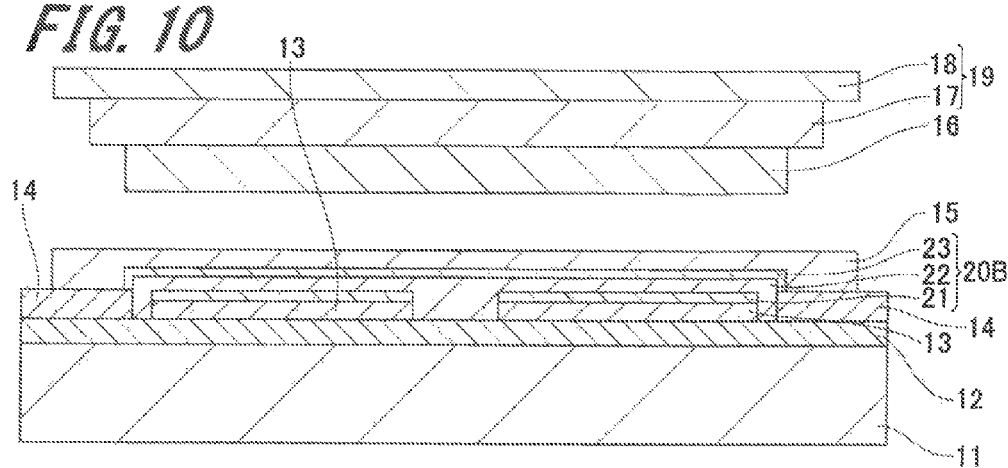
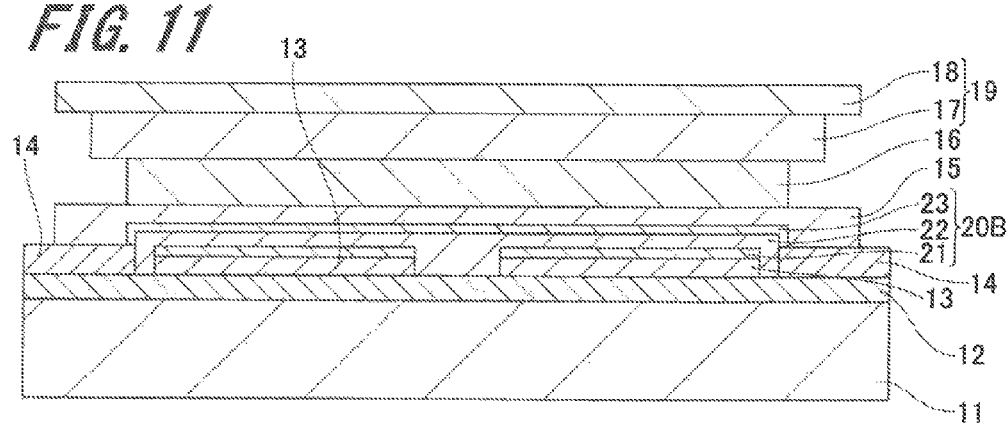
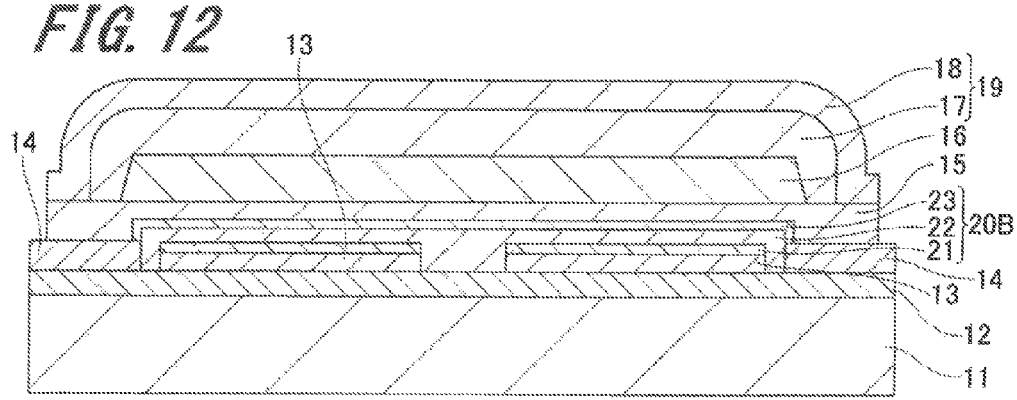

ORGANIC ELECTROLUMINESCENT ELEMENT HAVING A SEALING SUBSTRATE, AND METHOD FOR PRODUCING ORGANIC ELECTROLUMINESCENT ELEMENT

CROSS REFERENCE TO RELATED APPLICATION

This Application is a 371 of PCT/JP2015/058483 filed on Mar. 20, 2015 which, in turn, claimed the priority of Japanese Patent Application No. 2014-089021 filed on Apr. 23, 2014, both applications are incorporated herein by reference.

TECHNICAL FIELD

The present invention relates to an organic electroluminescent element sealed by a sealing substrate, and a method for producing the organic electroluminescent element.

BACKGROUND ART

An organic electroluminescent (EL) element (organic EL device and organic EL machine) using an organic substance can realize plane emission due to the specific wavelength by selection of an optimum organic material, and can emit light in a thin and solid form, and thus commercialization of thin large-area full-color displays, light source devices for electronic photograph, back light for liquid displays, light sources for biometrics authentication such as vein sensor, and lighting of plane emission, and the like become urgent. Furthermore, the quality developments such as material development, optimization of configuration, and increase in production process efficiency are progressing so as to achieve further cost reduction and improvement of reliability in order To enlarge the uses.

The organic EL element is a thin-film solid light-emitting element which is generally disposed, on a base substrate, with at least a first electrode, an organic functional layer (light-emitting layer) composed of multi-layered organic compounds, and a second electrode. Note that one of the first electrode and the second electrode constitutes an anode, and the other constitutes a cathode. In addition, the organic functional layer contains least one organic luminescent substance and is constituted of many organic compounds.

In the organic EL element having such a configuration, when a voltage is applied between the first electrode and the second electrode, a positive hole is injected from one of the electrodes (anode) to the light-emitting layer, and an electron is injected from the other electrode (cathode) to the light-emitting layer. In addition, the energy level of the organic luminescent substance is returned from the conductive band to the valence electron band by recombination of the positive hole and electron which are injected into the light-emitting layer in the light-emitting layer, and then an energy generated at that time is emitted as light from the light-emitting layer.

Recently, in the technical field of the organic EL element, there has been required the establishment of mass production technique in which integrated producing is performed by using a flexible transparent film substrate as a base and by supply from a roll, from the viewpoint of the requirements such as thinning, weight reduction, large sizing, improvement of productivity and impact resistance of the organic EL element panel. In formation of the organic EL element on the transparent film substrate, there has occurred the dark spot phenomenon in which oxygen and moisture which penetrate into the transparent film substrate or sealing substrate from the atmosphere with the lapse of time degrade electrodes and light-emitting materials, and then cause non-light emission. Accordingly, it is necessary to provide a gas barrier layer and an inorganic sealing layer, and furthermore to seal the surfaces and surroundings of the element by sticking the sealing substrate such as a metal foil through the use of a resin adhesive.

Furthermore, in the organic EL element, a flexible print circuit film (FPC) and the like is connected, by using an anisotropic conductive film (ACF) or the like, to a wiring led out from the first electrode and the second electrode to the outside of the sealing substrate caused to adhere by the resin adhesive. In the connection, a heat pressure-bonding process at 100 to 200° C. is required. Accordingly, it is necessary to prevent the adhesive used in the heat pressure-bonding process from protruding at the metal wiring and the ACF crimped portion. Furthermore, since the metal disposed on the sealing substrate for obtaining moistureproofness and heat releasing property is electrically conductive, electrical short-circuiting and leakage occur to thereby generate light emission failure, when the metal wiring and apart of the end portion of the metal make contact with each other.

With respect to the problem, there has been a proposal that, in the configuration in which the sealing substrate is bonded together via a sheet-like sealing member, the protrusion of the sheet-like sealing member is prevented by disposition of a spacer and an adhesive layer at the terminal connection side (for example, see Patent Literature 1, Patent Literature 2) .

CITATION LIST

Patent Literature

PTL 1: WO2010/024006
PTL 2: Japanese Patent Laid-Open No.2008-10211

SUMMARY OF INVENTION

Technical Problem

However, in a configuration of disposing the spacer and the adhesive layer at a terminal connection side, it is necessary to add many expensive inorganic particles made of glass or ceramics to the resin spacer in order to obtain heat resistance enough to be resistive to the ACF pressure-bonding process when using the resin spacer. In addition, there is a problem that these inorganic particles easily cause damage and clacks of the inorganic sealing layer at the time of pressure-bonding of the sealing substrate.

As described above, in the organic electroluminescent element, the improvement of the electric connection reliability at the connection between the external extraction electrode and the external equipment such as the FPC (flexible print circuit film) is required.

In order to solve the above problems, the present invention is to provide an organic electroluminescent element capable of improving the connection reliability with the external equipment.

Solution to Problem

The organic electroluminescent element of the present invention includes: a substrate; a gas barrier layer disposed on the substrate; a light-emitting part disposed on the gas barrier layer and comprising a first electrode, an organic functional layer, and a second electrode; an inorganic sealing layer which covers the light-emitting part; lead-out wiring that extends outside the inorganic sealing layer and is connected with the first electrode or the second electrode; and a sealing substrate including a metal layer and an electrical insulation layer which are bonded together via a resin adhesive layer on the inorganic sealing layer. In addition, above at least the lead-out wiring, the sealing substrate is folded to the substrate side, and at least any one of the metal layer and the insulation layer makes contact with the inorganic sealing layer.

The method for producing the organic electroluminescent element of the present invention includes the steps of: forming a gas barrier layer on a substrate; and forming a light-emitting part including a first electrode, an organic functional layer, and a second electrode, on the gas barrier layer. Additionally, the method for producing the organic electroluminescent element includes the steps of: forming lead-out wiring which is connected to the first electrode or the second electrode; and forming an inorganic sealing layer which covers the light-emitting part and a part of the lead-out wiring on the light-emitting part side. Furthermore, the method for producing the organic electroluminescent element includes the step of pressure-bonding a sealing substrate by joining the sealing substrate including a metal layer and an insulation layer which are bonded together via a resin adhesive layer on the inorganic sealing layer, and by folding at least an edge portion of the sealing substrate above the lead-out wiring so that at least anyone of the metal layer and the insulation layer makes contact with the inorganic sealing layer.

According to the organic electroluminescent element and the method for producing the organic electroluminescent element of the present invention, the light-emitting part is sealed by the inorganic sealing layer, and the sealing substrate is joined by the resin adhesive layer on the inorganic sealing layer.

In addition, the sealing substrate is folded to make contact with the inorganic sealing layer, above the lead-out wiring. Accordingly, the edge surface of the resin adhesive layer is covered with the sealing substrate above the lead-out wiring. Therefore, it is possible to prevent the exposure and leakage of the resin adhesive layer onto the lead-out wiring.

As a result, the connection reliability of the lead-out wiring of the organic electroluminescent element with the external equipment is enhanced.

Advantageous Effects of Invention

According to the present invention, it is possible to provide an organic electroluminescent element which can improve the connection reliability with the external equipment.

BRIEF DESCRIPTION OF DRAWINGS

FIG. 10 is a diagram showing the pressure-bonding process of the organic EL element according to the second embodiment.

FIG. 11 is a diagram showing the pressure-bonding process of the organic EL element according to the second embodiment.

FIG. 12 is a diagram showing the pressure-bonding process of the organic EL element according to the second embodiment.

DESCRIPTION OF EMBODIMENTS

Hereinafter, embodiments for carrying out the present invention will be explained, but the present invention is not limited thereto.

Note that the explanation is done in the following order.
1. Organic electroluminescent element (First embodiment)
2. Organic electroluminescent element (Second embodiment)
3. Method for producing organic electroluminescent element (Third embodiment)
4. Organic electroluminescent element module (Fourth embodiment)

<1. Organic Electroluminescent Element (First Embodiment)>

Figure 1:
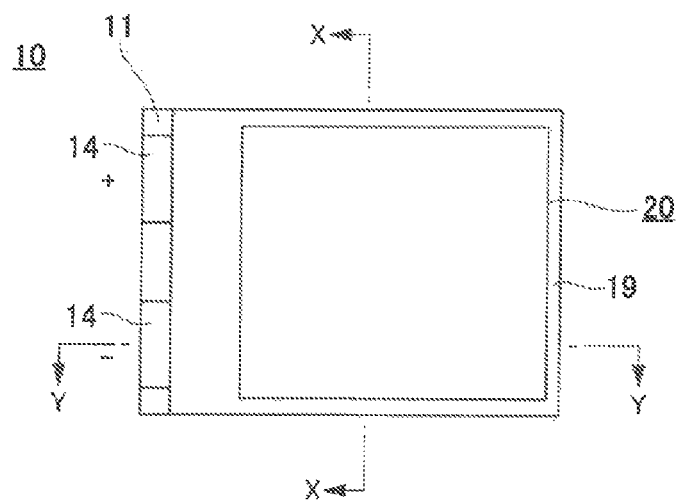
FIG. 1 is a plane view showing a schematic configuration of an organic EL element according to a first embodiment.
Figure 2:
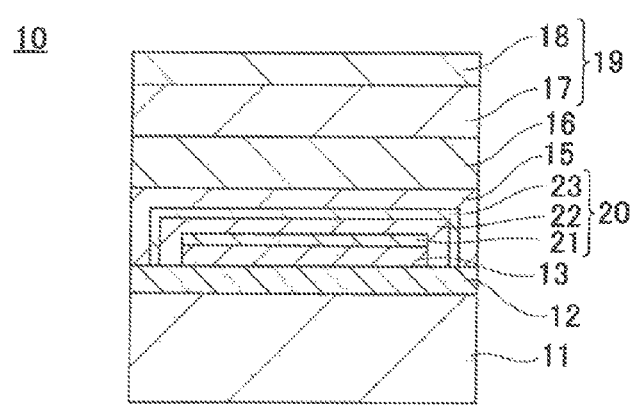
FIG. 2 is an X-X line cross-sectional view of the organic EL element according to the first embodiment shown in FIG. 1.
Figure 3:
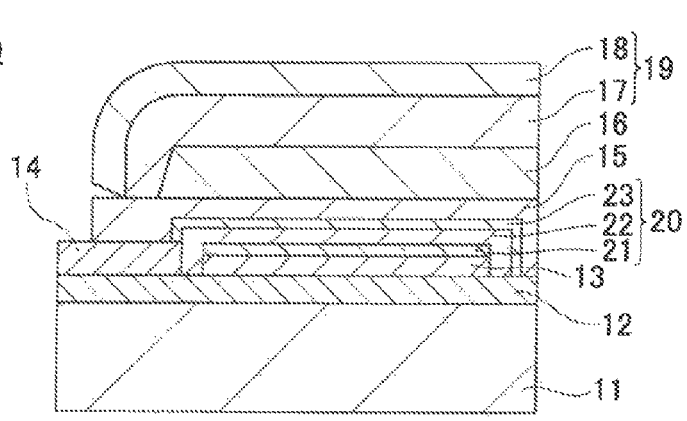
FIG. 3 is a Y-Y line cross-sectional view of the organic EL element according to the first embodiment shown in FIG. 1.

Hereinafter, the specific embodiment of the organic electroluminescent element (organic EL element) of the present invention will be explained. In FIGS. 1 to 3, the configuration of the organic EL element according to the first embodiment is shown. FIG. 1 is a plane view showing a schematic configuration of the organic EL element. FIG. 2 is an X-X line cross-sectional view of the organic EL element shown in FIG. 1. FIG. 3 is a Y-Y line cross-sectional view of the organic EL element shown in FIG. 1.

[Configuration of Organic EL Element]

As shown in FIG. 1, an organic EL element 10 has a configuration in which a light-emitting part 20 is sealed between a substrate 11 and a sealing substrate 19. In addition, the organic EL element 10 has lead-out wiring 14 led out outside the sealing substrate 19 from the light-emitting part 20.

Furthermore, as shown in FIG. 2, in the organic EL element 10, a gas barrier layer 12 is formed all over the substrate 11 in order to prevent the penetration of oxygen and moisture in the atmosphere through the substrate 11.

Additionally, the light-emitting part 20 of the organic EL element 10 is formed on the substrate 11 by lamination of a first electrode 21, an organic functional layer 22, and a second electrode 23. The organic EL element 10 contains at least a luminous organic material in the organic functional layer 22. For example, the organic EL element 10 is a white light-emitting element having a light-emitting dopant of each color of blue (B), green (G), and red (R) as luminous organic materials.

The first electrode 21 is formed on a base layer 13 on the gas barrier layer 12. The organic functional layer 22 is formed so as to cover the base layer 13 and the first electrode 21. Furthermore, the second electrode 23 is formed so as to cover the organic functional layer 22. In addition, an inorganic sealing layer 15 is formed so as to cover the whole surface of the light-emitting part 20 composed of the first electrode 21, the organic functional layer 22 and the second electrode 23. Additionally, the sealing substrate 19 composed of a metal layer 17 and an insulation layer 18 is joined on the inorganic sealing layer 15 via a resin adhesive layer 16.

Furthermore, as shown in FIG. 3, the lead-out wiring 14 is disposed so as to connect to the second electrode 23, on the substrate 11. In addition, the lead-out wiring 14 is led out outside the inorganic sealing layer 15 and the sealing substrate 19 on the substrate 11. Accordingly, the inorganic sealing layer 15 is disposed so as to cover only a part of the lead-out wiring 14 on the light-emitting part 20 side, and is disposed so as to expose the lead-out wiring 14 on the edge portion side of the substrate 11.

Note that, although not shown in FIG. 3, the lead-out wiring 14 which connects to the first electrode 21 is disposed, and is led out outside the inorganic sealing layer 15 and the sealing substrate 19.

Thereby, the whole surface of the light-emitting part 20 is configured to be sealed by the gas barrier layer 12, the inorganic sealing layer 15 and the lead-out wiring 14. In addition, the sealing substrate 19 is configured to be joined on the inorganic sealing layer 15 via the resin adhesive layer 16.

As shown in FIG. 3, in the organic EL element 10, the inorganic sealing layer 15 is formed so as to cover the whole of the light-emitting part 20. Accordingly, the inorganic sealing layer 15 is formed on the substrate 11 over an area larger than the light-emitting part 20, and has an external edge portion (bezel portion) outside the region where the light-emitting part 20 is formed. In the external edge portion of the inorganic sealing layer 15, between the inorganic sealing layer 15 and the substrate 11, there are not formed the first electrode 21, the organic functional layer 22 and the second electrode 23 which constitute the light-emitting part 20, but only the lead-out wiring 14 and the gas barrier layer 12 are formed.

In addition, in the organic EL element 10, the lead-out wiring 14 connected to the first electrode 21 or the second electrode 23 is led out on the side of one direction on the substrate 11. As described above, the organic EL element 10 is mounted on external equipment in the direction of one side where the lead-out wiring 14 is led out. On the side where the lead-out wiring 14 of the organic EL element 10 is disposed and which is to be mounted on the external equipment (mounting side), the exposed portion of the sealing substrate 19 serves as an electrode for connecting to the external equipment, by exposing the lead-out wiring 14 from the sealing substrate 19.

As shown in FIG. 3, the edge of the sealing substrate 19 is folded to the side of the substrate 11, on the mounting side where the lead-out wiring 14 is formed. Then, the edge of the sealing substrate 19 makes contact with the upper surface of the inorganic sealing layer 15. As described above, the configuration is such that the end surface of the resin adhesive layer 16 is not exposed on the mounting side, by folding the sealing substrate 19 on the mounting side and making contact with the inorganic sealing layer 15.

Furthermore, as shown in FIGS. 2 and 3, the edge of the sealing substrate 19 is not folded on a side other than the mounting side of the organic EL element 10, and the end surface of the resin adhesive layer 16 is exposed to the end surface of the organic EL element 10. Namely, the sealing substrate 19 is not folded, and the edge of the sealing substrate 19 and the edge of the resin adhesive layer 16 are formed at the same position.

Since the resin adhesive layer 16 is not exposed at the mounting side of the organic EL element 10, it is possible to prevent the outflow of the resin adhesive layer 16 to the mounting side. Accordingly, it is possible to remove any contamination by the resin adhesive layer 16 to a portion serving as an electrode of the lead-out wiring 14, for connecting to the external equipment. Thereby, it is possible to enhance the electric connection reliability between the organic EL element 10 and the external equipment.

Furthermore, since the lead-out wiring 14 is not disposed on the side other than the mounting side of the organic EL element 10, there is no problem as to electrode contamination due to the outflow of the resin adhesive layer 16. Accordingly, the end surface of the resin adhesive layer 16 may be in a state of exposure to the end surface of the organic EL element 10.

In the sealing substrate 19, at least at the mounting side, it is necessary that the sealing substrate 19 makes contact with the inorganic sealing layer 15, on the region where the lead-out wiring 14 is formed. In addition, in the sealing substrate 19, it is preferable that at least any one of the metal layer 17 and the insulation layer 18 makes contact with the inorganic sealing layer 15 all over the region of the mounting side.

Since at least any one of the metal layer 17 and the insulation layer 18 which constitute the sealing substrate 19 makes contact with the inorganic sealing layer 15, it is possible to employ the configuration in which the resin adhesive layer 16 is not exposed.

Furthermore, it is preferable that both of the metal layer 17 and the insulation layer 18 are in contact with the inorganic sealing layer 15.

In the configuration in which only the metal layer 17 makes contact with, the configuration is such that there is a portion where the metal layer 17 is exposed at the edge portion of the mounting side.

In a case where the metal layer 17 is exposed, short circuiting, leakage, and the like are caused in electrical connection with the external equipment, if electrical connection between electrodes of the external equipment and the metal layer 17 takes place. Accordingly, it is preferable to employ the configuration in which the metal layer 17 is covered with the insulation layer 18 so that the metal layer 17 is not exposed, that is, the configuration in which the insulation layer 18 makes contact with the inorganic sealing layer 15.

Additionally, in the configuration in which only the insulation layer 18 makes contact, the configuration is such that the metal layer 17 is not formed on a part of the surface with which the resin adhesive layer 16 makes contact. In this case, there is a problem of strength when only the insulation layer 18 exists. Furthermore, at the edge portion of the sealing substrate 19, a folding state of the sealing substrate is easily maintained due to plasticity (ductility, malleability) of a metal, by having the metal layer 17. Namely, when only the insulation layer 18 is formed, it becomes difficult to maintain the folding state, thereby influencing the reliability, because of restoring force of the resin film, or the like constituting the insulation layer 18.

Furthermore, in the sealing substrate 19, the metal layer 17 preferably has a larger thickness than that of the insulation layer 18. As described above, at the portion where the sealing substrate 19 is folded, the force of restoring a folded state to a state before being folded, works by the resin or the like of the insulation layer 18. Accordingly, in order to keep the sealing substrate 19 in a state of being folded, it is necessary to absorb the restoring force of the insulation layer 18 by the elastically deformed metal.

Therefore, it becomes easy to maintain the sealing substrate 19 in a state of being folded, by forming the metal layer 17 so as to be thicker than the insulation layer 18 and by enhancing the strength of the elastically deformed metal.

In addition, the position in which the sealing substrate 19 makes contact with the inorganic sealing layer 15 is preferably the upper surface of the external edge portion of the inorganic sealing layer 15. It is necessary to apply a stress from the sealing substrate 19 to the substrate 11 side when folding the sealing substrate 19. When the stress generated at the folding of the sealing substrate 19 is applied to the light-emitting part 20, there is a possibility that each of the members which constitute the light-emitting part 20 is damaged. Accordingly, it is preferable to employ the configuration in which the stress generated at the folding of the sealing substrate 19 is difficult to be applied to the light-emitting part 20. Therefore, it is preferable that the folding portion of the sealing substrate 19 is disposed at the external edge portion of the inorganic sealing layer 15.

It is preferable that the inorganic sealing layer 15 has a high hardness. In order to prevent damage due to the stress generated at the folding of the sealing substrate 19, or in order to protect the light-emitting part 20 formed under the inorganic sealing layer 15, it is preferable that a surface hardness of the inorganic sealing layer 15 is 400 HV or more in terms of Vickers hardness. Furthermore, it is preferable that the thinnest portion of the inorganic sealing layer 15 has a thickness of 200 nm or more.

[Configuration of Organic EL Element]

Hereinafter, each configuration of the organic EL element 10 will be explained in detail. Note that the configuration of the organic EL element 10 explained below is one example for configuring the organic EL element 10, and other configurations can also be applied.

[Substrate]

The substrate 11 (base, substrate, base material or support) is a transparent film such as a thin glass film, a thin ceramic film, a resin film, a resin film containing glass fiber or carbon fiber. It is particularly preferable that a transparent resin film is used from the viewpoint of weight reduction, external impact resistance, and cost.

Examples of materials for forming the transparent resin film that can be used include polyolefins such as polyethylene, polypropylene and a cyclic olefin copolymer (COP), polyesters such as a polyamide, a polyimide, polyethylene terephthalate (PET) and polyethylene naphthalate (PEN), cellulose esters such as cellophane, cellulose diacetate, cellulose acetate butylate, cellulose acetate propionate (CAP), cellulose triacetate (TAC) and cellulose nitrate, polyvinylidene chloride, polyvinyl alcohol, polyethylene vinyl alcohol copolymer (EVOH), syndiotactic polystyrene, polycarbonate, norbornen resin, polymethylpenten, polyether ketone, polyimide, polyether sulphone (PES), polyphenylene sulfide, polysluphones, polyether imide, polyether ketone imide, fluoro resins, acrylate resins such as polymethyl methacrylate (PMMA), polyarylates, and derivatives thereof. Furthermore, cycloolefins-based resins referred to as Alton (registered trade mark: manufactured by JSR) or APEL (registered trade mark: manufactured by Mitsui Chemicals) can also be used as the materials for forming the transparent resin film.

Preferred thickness is 50 to 300 μm. When the thickness is less than 50 μm, a sufficient strength cannot be obtained, and when the thickness is 300 μm or more, flexibility is lowered.

[Gas Barrier Layer]

A gas barrier layer 12 is formed all over the surface side where at least the light-emitting part 20 is formed, on one side or both sides of the substrate 11. The gas barrier layer 12 is formed in order to prevent penetration of moisture and oxygen in the atmosphere and to ensure electric insulation with respect to the first electrode 21, the organic functional layer 22 and the second electrode 23. The gas barrier layer 12 may be not only a film of an inorganic material, but also a film of composite material of an inorganic material and an organic material, or a hybrid film obtained by laminating these films.

The gas barrier layer 12 is preferably a transparent insulation film having the gas barrier property, and have performances such as a water vapor transmission rate (environmental condition: 25±0.5° C., relative humidity (90±2)% RH) of about 0.01 g/[m$^2$·day·atm] or less, an oxygen transmission rate of about 0.01 cm$^3$/[m$^2$·day·atm] or less, an electric resistance of 1×10$^{12}$ Ω·cm or more, and a light transmittance in the visual light region of about 80% or more. Particularly, the gas barrier layer is preferably constituted of the multilayered film having such a high gas barrier property as an oxygen transmission rate of 0.0001 cm$^3$/[m$^2$·day·atm] or less, and a water vapor transmission rate of about 0.0001 g/[m$^2$·day·atm] or less. Note that the "water vapor transmission rate" is a value measured by using the infrared ray sensor method in accordance with JIS (Japan Industrial Standard)-K7129 (1992), the "oxygen transmission rate" is a value measured by the coulometric method in accordance with JIS-K7126 (1987).

An arbitrary material can be used as a material for forming the above-described gas barrier layer 12 as long as the material can suppress penetration of water or gases such as oxygen which deteriorates the organic EL element 10, into the organic EL element 10.

For example, the gas barrier layer can be constituted of a film of an inorganic material such as silicon oxide, silicon nitride, silicon oxide nitride, silicon carbide, silicon oxide carbide, aluminum oxide, aluminum nitride, titanium oxide, zirconium oxide, niobium oxide, or molybdenum oxide. In the organic EL element 10, the gas barrier layer 12 is preferably constituted of a film of an inorganic material mainly containing a silicon compound such as silicon nitride or silicon oxide, in consideration of the gas barrier property, transparency, and easy cutting at the time of division.

Note that, in order to improve the brittleness of the gas barrier layer 12, it may also be possible to employ a configuration of not only the film of the inorganic material, but also a film in combination with a film composed of a composite material of an organic material, or a hybrid film obtained by laminating these films. In the case, the lamination order of the film of the inorganic material and the film of the organic material is optional, and a plurality of the organic materials and the inorganic material may be laminated alternately. It is preferable that the outermost surface of the gas barrier layer 12 is made of an inorganic material from the viewpoint of insulation and gas barrier property, and sealing by being brought in contact with the inorganic sealing layer 15 described below. Furthermore, it is also possible to employ a configuration in which each of the substrate 11 and the gas barrier layer 12 is laminated in two or more layers, as a measure against defects/pinholes of the gas barrier layer 12.

Although a thickness of the gas barrier layer 12 may be optionally se as long as the above-described performances are satisfied, it is preferable that a total thickness is within the range of 50 to 1000 nm in consideration of the flexibility. When the thickness is 50 nm or less, pinholes are easily generated and the sufficient gas barrier property cannot be obtained, and when thickness is 1000 nm or more, clacks and the like are easily generated at the time of folding.

[Base Layer]

A base layer 13 is a layer formed between the gas barrier layer 12 and the first electrode 21, and is formed before the formation of the first electrode 21 in order to enhance flattening of the surface of the gas barrier layer 12 and enhance the adhesive property of the first electrode 21. Particularly, the base layer is suitably used when a thin metal film such as silver is used for the first electrode 21. Since the base layer 13 is made of a material which easily permeates water vapor, it is preferable that the base layer has a configuration of being protected by the gas barrier layer 12 and the inorganic sealing layer 15.

A film thickness is used within the range of 50 to 500 nm. When the thickness is 50 nm or less, flatness cannot be obtained, and when the thickness is 500 nm or more, it is disadvantageous from economical point of view.

A material of the base layer 13 is preferably a transparent resin material, and suitable examples thereof include electrically conductive polymers such as polyaniline, polyphenylamine, PEDOT/PSS (polyethylenedioxythiophene/polystyrene sulfonic acid), PPV (polyphenylenebinylene), and tertiary amines. In addition, it is also possible to impart the effect of enhancing the light scattering property by addition of acrylic resin particles or niobium oxide-based inorganic particles having a high refractive index to each of the resin binder components, in order to impart light scattering property.

[First Electrode]

The first electrode 21 (anode) is an electrode film to supply (inject) the positive hole to the light emitting layer, and is formed by an electrode material having a large work function (4 eV or more) such as a metal, an alloy, an electrically conductive compound, and a mixture thereof, for example.

Specifically, in the organic EL element 10, when lead-out the light from the first electrode 21 side, the first electrode 21 may be formed by a thin metal film such as gold, silver or aluminum, a light permeable metal oxide material such as ITO (indium tin oxide), tin oxide (SnO$_2$), zinc oxide (ZnO), gallium zinc oxide (GZO), indium gallium zinc oxide (IGZO), for example.

Note that, in the organic EL element 10, when lead-out the light from the first electrode 21 side, it is preferable that a light transmittance of the first electrode 21 is about 50% or more in the visual light region. In addition, it is preferable that a sheet resistance (surface resistance) of the first electrode 21 has a value of 300 Ω/sq. or less. Furthermore, the first electrode 21 may be a multilayered film. For example, there may be a configuration in which the above-described base layer 13 and the material layer having a high refractive index such as niobium oxide may be disposed.

A film thickness of the first electrode 21 may vary optionally depending on the layer configuration, electric resistance and light transmittance of the material to be used, and is preferably set within the range of 5 to 200 nm.

[Organic Functional Layer]

The organic EL element 10 has a configuration in which the luminescent organic functional layer 22 is disposed between the electrodes. The organic functional layer 22 has at least the light-emitting layer, and in addition, other layers may be disposed between the light-emitting layer and each of the electrodes.

A representative elemental configuration of the organic functional layer 22 can include the following configuration, but is not limited thereto.

(1) Light-emitting layer
(2) Light-emitting layer/Electron transport layer
(3) Positive hole transport layer/Light-emitting layer
(4) Positive hole transport layer/Light-emitting layer/Electron transport layer
(5) Positive hole transport layer/Light-emitting layer/Electron transport layer/Electron-injecting layer
(6) Positive hole-injecting layer/Positive hole transport layer/Light-emitting layer/Electron transport layer
(7) Positive hole-injecting layer/Positive hole transport layer/(Electron-blocking layer/) Light-emitting layer/ (Positive hole-blocking layer/) Electron transport layer/ Electron-injecting layer Among them, the configuration of (7) is preferably used, but is not limited thereto.

In the above configuration, the light-emitting layer is composed of a mono-layer or multi-layer. In a case of the plurality of light-emitting layer, a non-light-emitting intermediate layer may be disposed between the respective light-emitting layers.

In addition, as necessary, a positive hole-blocking layer (positive hole barrier layer), an electron-injecting layer (cathode buffer layer) or the like may be disposed between the light-emitting layer and the cathode. Additionally, an electron-blocking layer (electron barrier layer), a positive hole-injecting layer (anode buffer layer) or the like may be disposed between the light-emitting layer and the anode.

The electron transport layer is a layer having a function of transporting an electron. Theelectrontransportlayeralso includes the electron-injecting layer, and the positive hole-blocking layer in a broad sense. Furthermore, the electron transport layer may be composed of a plurality of layers.

The positive hole transport layer is a layer having a function of transporting a positive hole. The positive hole transport layer also includes the positive hole-injecting layer, and the electron-blocking layer in a broad sense. Furthermore, the positive hole transport layer maybe composed of a plurality of layers.

(Tandem Structure)

Furthermore, the organic EL element 10 may be an element of so-called Tandem structure in which a plurality of organic functional layers 22 including at least one light-emitting layer is laminated.

A representative example of an element configuration having a tandem structure is as follows.

(1) Anode/first organic functional layer/intermediate connector layer/second organic functional layer/cathode
(2) Anode/first organic functional layer/intermediate connector layer/second organic functional layer/intermediate connector layer/third organic functional layer/cathode Here, the above first organic functional layer, second organic functional layer, and third organic functional layer may be all the same or different. It may be possible that two organic functional layers are the same and the remaining one is different.

In addition, each organic functional layer may be directly laminated or may be laminated via the intermediate connector layer. For example, the intermediate connector layer is constituted of an intermediate electrode, an intermediate conductive layer, a charge-generating layer, an electron extraction layer, a connecting layer, an intermediate insulation layer, or the like, and may be made by known material formulation as long as the layer has a function of supplying an electron to an adjacent layer to the anode, and supplying a positive hole to an adjacent layer on the cathode side.

Examples of materials used in the intermediate connector layer include an electrically conductive inorganic compound layer such as ITO (indium tin oxide), IZO (indium zinc oxide), $ZnO_2$, TiN, ZrN, HfN, $TiO_x$, $VO_x$, CuI, InN, GaN, $CuAlO_2$, $CuGaO_2$, $SrCu_2O_2$, $LaB_6$, $RuO_2$, or Al, a two-layered film such as $Au/Bi_2O_3$, a multi-layered film such as $SnO_2/Ag/SnO_2$, ZnO/Ag/ZnO, $Bi_2O_3/Au/Bi_2O_3$, $TiO_2/TiN/TiO_2$, or $TiO_2/ZrN/TiO_2$, a fullerene such as C60, an electrically conductive organic layer such as oligothiophene, and an electrically conductive organic compound layer such as metal phthalocyanine, metal-free phthalocyanine, metal porphyrin, or metal-free porphyrin, and the like, but are not limited thereto.

Examples of the tandem-type organic EL element include elemental configurations and materials described in U.S. Pat. Nos. 6,337,492, 7,420,203, 7,473,923, 6,872,472, 6,107,734, 6,337,492, WO 2005/009087, Japanese Patent Laid-Open No.2006-228712, Japanese Patent Laid-Open No.2006-24791, Japanese Patent Laid-Open No. 2006-49393, Japanese Patent Laid-Open No.2006-49394, Japanese Patent Laid-Open No.2006-49396, Japanese Patent Laid-Open No.2011-96679, Japanese Patent Laid-Open No.2005-340187, JP Patent No.4711424, JP Patent No.3496681, JP Patent No.3884564, JP Patent No.4213169, Japanese Patent Laid-Open No.2010-192719, Japanese Patent Laid-Open No.2009-076929, Japanese Patent Laid-Open No.2008-078414, Japanese Patent Laid-Open No.2007-059848, Japanese Patent Laid-Open No.2003-272860, Japanese Patent Laid-Open No.2003-045676, and WO 2005/094130, but are not limited thereto.

(Positive Hole-Injecting Layer)

In the organic EL element 10, the positive hole-injecting layer (anode buffer layer) may be disposed between the first electrode 21 and the light-emitting layer, or between the second electrode 23 and the positive hole transport layer. Note that the positive hole-injecting layer is disposed between the first electrode 21 and the light-emitting layer or the positive hole transport layer in order to reduce a driving voltage and to improve an emission luminance of the organic EL element 10. The compounds described in Japanese Patent Laid-open No.2000-160328 can be used as materials for forming the positive hole-injecting layer (anode buffer layer).

(Positive Hole Transport Layer)

The positive hole transport layer is a layer where a positive hole supplied from the first electrode 21 is transported (injected) to the light-emitting layer. In addition, the positive hole transport layer also acts as a barrier that blocks the inflow of electron from the second electrode 23 side. Therefore, the term of "positive hole transport layer" is used in a broad sense, that is, in a sense of including the positive hole-injecting layer and/or the electron-blocking layer.

Any organic or inorganic materials can be used as the positive hole transport material as long as the material can express the function of transporting (injecting) the above positive hole and the function of blocking the inflow of the electron. Specific examples of the positive hole transport materials include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high molecular oligomer (particularly a thiophene oligomer).

Furthermore, there can be used, as the positive hole transport material, for example, a porphyrin compound, an aromatic tertiary amine compound (a styrylamine compound) and the like. Particularly, according to the present embodiment, it is preferable to use the aromatic tertiary amine compound as the positive hole transport material.

Examples of the aromatic tertiary amine compounds that can be used include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-metyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, N,N,N-tri (p-tolyl) amine, and the like. Moreover, examples of the aromatic tertiary amine compound include the styrylamine compound such as 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene. Furthermore, those having two condensed aromatic rings in a molecule as described in U.S. Pat. No.5,061,569, for example, 4,4'-bis[N-(1-naphthyl)-N-phenylamino]biphenyl (NPD), and 4,4',4''-tris[N-(3-methylphenyl)-N-phenylamino]triphenylamine (MTDATA) in which three triphenylamine units are bonded in a star burst as described in Japanese Patent Laid-Open No.04-308688 may be used.

Moreover, polymer materials in which the above various positive hole transport material are introduced into a polymer chain, or polymer materials using the above various positive hole transport materials as a main chain of a polymer can also be used as the positive hole transport material. Note that inorganic compounds such as a p-type Si and a p-type SiC can also be used as the positive hole transport material and a formation material of the positive hole-injecting layer.

Furthermore, it may also be possible to use, as the positive hole transport material, so-called p-type positive hole transport materials described in documents such as Japanese Patent Laid-Open No.11-251067 and the document by J. Huang et. al. (Applied Physics Letters 80 (2002), p. 139). Note that it is possible to obtain a light-emitting element having higher efficiency when using these materials for the positive hole transport material.

Furthermore, according to the present embodiment, the positive hole transport layer having a high p property (positive hole rich) may be formed by doping of the positive hole transport layer with impurities. Examples include those described in documents such as Japanese Patent Laid-Open Nos.04-297076, 2000-196140, 2001-102175 and J. Appl. Phys., 95, 5773 (2004), and the like. It is possible to produce the organic EL element 10 which consumes lower electric power in the case of using the positive hole transport layer rich in positive hole.

(Light-Emitting Layer)

The light-emitting layer is a layer where the positive hole injected directly from the first electrode 21 or injected via the positive hole transport layer or the like from the first electrode 21, and where the electron injected directly from the second electrode 23 or injected through the electron transport layer or the like from the second electrode 23 are recombined to emit light. Note that the light-emitting part may be inside the light-emitting layer, or may be on the interface between the light-emitting layer and the layer adjacent thereto.

In addition, the light-emitting layer may be a mono-layer or multi-layer. Note that, when a plurality of light-emitting layer is disposed, the configuration may be such that the plurality of the light-emitting layers having different emitting lights is laminated. Furthermore, when a plurality of light-emitting layer is disposed, a non-light-emitting intermediate layer may be disposed between the adjacent light-emitting layers. In this case, the intermediate layer can be formed by the same material as the host compound described below in the light-emitting layer.

According to the present embodiment, the light-emitting layer is formed by an organic light-emitting material which contains a host compound (light-emitting host) and a light-emitting material (light-emitting dopant). In the light-emitting layer having such a configuration, it is possible to obtain any emitting color light by appropriately controlling the luminescent wavelength of the light-emitting material, the kind of the light-emitting material to be included, or the like.

(1. Host Compound)

It is preferable to use, as the host compound contained in the light-emitting layer, a compound having, in phosphorescence emission at room temperature (25° C.), a phosphorescence quantum yield of less than about 0.1. Particularly, a compound having a phosphorescence quantum yield of less than about 0.01 is preferably used. Furthermore, among the various compounds contained in the light-emitting layer, a volume ratio of the host compound in the light-emitting layer is preferably a value of about 50% or more.

Moreover, a known host compound can be used as the host compound. In such a case, the host compound may be used alone or in combination of plural kinds of host compounds. It is possible to adjust a transfer degree (transfer amount) of charges (positive hole and/or electron), and to enhance a light emission efficiency of the organic EL element 10, by using a plurality of host compounds.

There can be used, as the host compound having the above-described properties, a compound such as a well-known low-molecular-weight compound, a high-molecular-weight compound having a repeating unit, or a low-molecular-weight compound having a polymerizable group such as vinyl group or epoxy group (vapor-deposition polymerizable emission host). Note that it is preferable to use, as the host compound, a compound having a positive hole transport function, an electron transport function, a function of preventing the increase in a light emission wavelength, and a high Tg (glass transition temperature). However, the glass transition temperature Tg here is a value obtained by using DSC (Differential Scanning Colorimetry) in accordance with JIS-K 7121.

Specific examples of the host compounds include compounds described in the following documents such as Japanese Patent Laid-Open Nos.2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Note that, in the present embodiment, the host compound is preferably a carbazole derivative, particularly preferably a compound of a carbazole derivative and dibenzofuran compound.

(2. Light-Emitting Material)

It is possible to use, as the light-emitting material (light-emitting dopant), for example, a phosphorescence emitting material (a phosphorescent compound, a phosphorescence emitting compound),a fluorescent emitting material, and the like. However, it is preferable to use, as the light-emitting material, the phosphorescence emitting material from the viewpoint of improvement of light emission efficiency.

The phosphorescence emitting material is a compound in which light emission can be obtained from an excited triplet state. Specifically, the phosphorescence emitting material is a compound which emits phosphorescence at room temperature (25° C.) and a phosphorescence quantum yield at 25° C. is about 0.01 or more. However, in the present embodiment, it is preferable to use a phosphorescence emitting material having a value of a phosphorescence quantum yield of about 0.1 or more. Note that the phosphorescence quantum yield can be measured by, for example, a method described on page 398 of "Spectroscopy II of Lecture of Experimental Chemistry vol.7, 4th edition" (1992, published by Maruzen Co., Ltd.). The phosphorescence quantum yield in a solution can be measured by using various solvents, and in the present embodiment, a light-emitting material that a phosphorescence emitting material can achieve the above-described phosphorescence quantum yield of about 0.01 or more with one of appropriate solvents may be used.

Furthermore, the light-emitting layer may contain one kind of the light-emitting material, or may contain a plural kinds of light-emitting materials which have different maximum light emission wavelength. When using a plural kinds of light-emitting materials, a plurality of lights having different wavelengths can be mixed to obtain light having an optional luminous color. For example, when adding a blue dopant, a green dopant and a red dopant (three kinds of light-emitting materials) to the light-emitting layer, a white color light can be obtained.

Regarding process (principle) of light emission (phosphorescent emission) in the light-emitting layer which contains the host compound and the phosphorescent emitting material described above, there are the following two kinds of processes.

The first light emission process is a process of an energy transfer type. In the light emission process of the type, first, carriers (positive hole and electron) recombine on the host compound in the light-emitting layer where the carriers are transferred to produce an excited state of the host compound. Then, the energy generated at that time is transferred from the host compound to the phosphorescence emitting material (the energy level of the excited state is transferred from the excited level of the host compound to the excited level (excited triplet)), and then light is emitted from the phosphorescence emitting material.

The second light emission process is a light emission process of a carrier trap type. In the light emission process of the type, the phosphorescence emitting material traps the carriers (positive hole and electron) in the light-emitting layer. As a result, the carriers recombine on the phosphorescence emitting material, and then light is emitted from the phosphorescence emitting material. In every light emission process described above, it is necessary that the energy level of the excited state of the phosphorescence emitting material is lowered than the energy level of the excited state of the light-emitting host.

The desired phosphorescence emitting material can be suitably selected, as the phosphorescence emitting material which generates the above-described light emission processes, from the well-known various phosphorescence emitting materials (phosphorescence emitting compounds) used for the conventional organic EL element. For example, a complex-based compound containing a metal of the groups 8 to 10 in the element periodic table can be used as the phosphorescence emitting material. Among the complex-based compounds, it is preferable to use any of an iridium compound, an osmium compound, a platinum compound (a platinum complex-based compound) or a rare earth metal complex, as the phosphorescence emitting material. In the present embodiment, particularly preferable phosphorescence emitting material to be used is an iridium compound.

In addition, examples of the fluorescence emitting material (fluorescence emitting body, fluorescent dopant) include a coumarin-based coloring matter, a pyran-based coloring matter, a cyanine-based coloring matter, a croconium-based coloring matter, a squarylium-based coloring matter, an oxobenzanthracene-based coloring matter, a fluorescein-based coloring matter, a rhodamine-based coloring matter, a pyrylium-based coloring matter, a perylene-based coloring matter, a stilbene-based coloring matter, a polythiophene-based coloring matter, or a rare earth metal complex-based fluorescent material, or the like.

Figure 4:
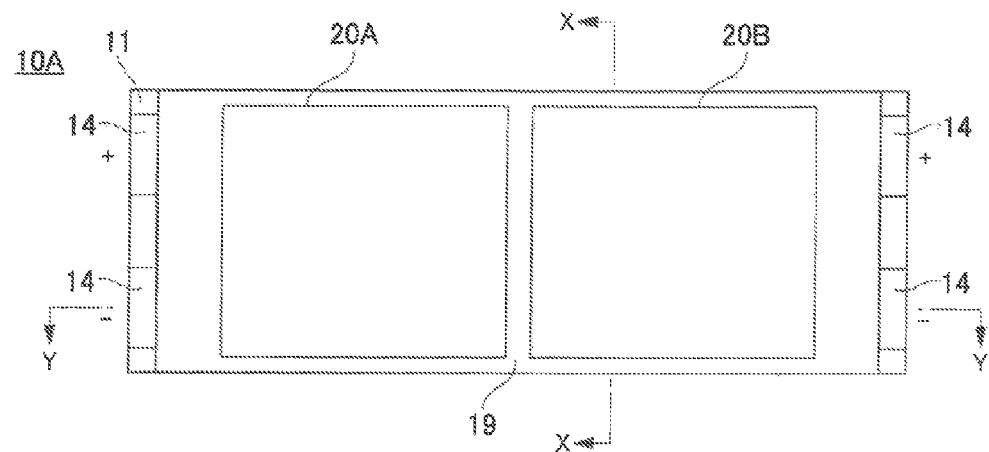
FIG. 4 is a plane view showing a schematic configuration of the organic EL element according to a second embodiment.

Note that a color of light-emitted by the organic EL element 10 is a color obtained by measuring a color emitted from the organic EL element 10 by a spectroradiometric luminance meter CS-2000 (manufactured by Konica Minolta Sensing, Inc.), and the measured result is applied to the CIE (Commission Internationale de l'Eclairage) chromaticity coordinate (for example, in FIG. 4 .16 on page 108 of "Shinpen Shikisai Kagaku Handbook" (edited by The Color Science Association of Japan, Tokyo Daigaku Shuppan Kai, 1985)). Specifically, the "white color" used herein means a color which shows chromaticity in the CIE 1931 Color Specification System at 1000 cd/m$^2$ within the region of X=0.33±0.07 and Y=0.33±0.07, when measurement is done to 2-degree viewing angle front luminance via the aforesaid method.

In addition, the method for obtaining the white color emission is not limited to the method in which a plurality of light-emitting material having different wavelengths is contained. For example, it may be possible to constitute the light-emitting layer by laminating a blue light-emitting layer, a green light-emitting layer and a red light-emitting layer, and then obtain the white color light emission by mixing the lights emitted from each light-emitting layer.

(Electron Transport Layer)

The electron transport layer is a layer which transports (injects) the electrons supplied from the second electrode 23 to the light-emitting layer. In addition, the electron transport layer acts as a barrier that blocks the inflow of the positive hole from the first electrode 21 side. The term of "electron transport layer" is sometimes used in a broad sense of including the electron-injecting layer and/or the positive hole-blocking layer.

Arbitrary material can be used as long as an electron transport material used in the electron transport layer adjacent to the second electrode 23 side of the light-emitting layer (the electron transport layer when the electron transport layer is in the single layer, and the electron transport layer positioned on a side closest to the light-emitting layer when the electron transport layer is disposed in a plural number) has a function that transmits (transports) the electron injected from the second electrode 23 to the light-emitting layer. For example, an arbitrary compound can be appropriately selected for use from among the well-known various compounds used in the conventional organic EL element, as the electron transport material and.

More specifically, examples of the electron transport materials that can be used include metal complexes such as a fluorenone derivative, a carbazole derivative, an azacarbazole derivative, an oxazole derivative, a trizole derivative, a silole derivative, a pyridine derivative, a pyrimidine derivative, and an 8-quinolinole derivative. Examples of other electron transport materials that can also be used include a metal phthalocyanine or a metal-free phthalocyanine, or compounds obtained by substituting each of these terminals with an alkyl group, a sulfonic acid group or the like. In addition, in the present embodiment, for example, a dibenzofuran derivative can also be used as the electron transport material.

Furthermore, in the present embodiment, an electron transport layer having a high n-property (electron rich) may also be formed by doping of the electron transport layer with impurities as a guest material. Specific examples of the electron transport layers each having such a configuration are described in each of Japanese Patent Laid-Open Nos. 04-297076, 10-270172, 2000-196140, 2001-102175, as well as in J. Appl. Phys., 95, 5773 (2004). Specifically, an alkali metal salt of an organic substance can be used as the guest material (doping material).

When the alkali metal salt of an organic substance is used as the doping material, the kind of the organic substance is arbitrary, and examples of the usable organic substances include compounds including: a salt of formic acid, a salt of acetic acid, a salt of propionic acid, a salt of butylic acid, a salt of valeric acid, a salt of caproic acid, a salt of enanthic acid, a salt of caprylic acid, a salt of oxalic acid, a salt of malonic acid, a salt of succinic acid, a salt of benzoic acid, a salt of phthalic acid, a salt of isophthalic acid, a salt of terephthalic acid, a salt of salicylic acid, a salt of pyruvic acid, a salt of lactic acid, a salt of malic acid, a salt of adipic acid, a salt of mesylic acid, a salt of tosic acid, a salt of benzensulfonic acid, and the like. Among them, preferable organic substance used is a salt of formic acid, a salt of acetic acid, a salt of propionic acid, a salt of butylic acid, a salt of valeric acid, a salt of caproic acid, a salt of enanthic acid, a salt of caprylic acid, a salt of oxalic acid, a salt of malonic acid, a salt of succinic acid, a salt of benzoic acid. Further preferable organic substance is an aliphatic carboxylic acid including: a salt of formic acid, a salt of acetic acid, a salt of propionic acid, a salt of butylic acid, a salt of valeric acid, a salt of caproic acid, a salt of enanthic acid, a salt of caprylic acid, a salt of oxalic acid, a salt of malonic acid, a salt of succinic acid, and a salt of benzoic acid, and when the aliphatic carboxylic acid is used, the number of carbon atoms is preferably 4 or less. Note that the most preferable organic substance includes a salt of acetic acid.

The kind of alkali metal which constitutes the alkali metal salt of the organic substance is arbitrary, and for example, Li, Na, K, or Cs can be used. Among these alkali metals, a preferred alkali metal is K or Cs, and more preferable alkali metal is Cs.

Accordingly, the alkali metal salt of the organic substance which can be used as the doping material of the electron transport layer is a compound obtained by combining the above-described organic substance and the above-described alkali metal. Specific examples of the doping materials that can be used include Li formate, K formate, Na formate, Cs formate, Li acetate, K acetate, Na acetate, Cs acetate, Li propionate, Na propionate, K propionate, Cs propionate, Li oxalate, Na oxalate, K oxalate, Cs oxalate, Li malonate, Na malonate, K malonate, Cs malonate, Li succinate, Na succinate, K succinate, Cs succinate, Li benzoate, Na benzoate, K benzoate, or Cs benzoate. Among them, the preferable doping material is Li acetate, K acetate, Na acetate or Cs acetate, and the most preferable doping material is Cs acetate. Note that a preferred content of the doping material is a value within the range of about 1.5 to 35% by mass with respect to the electron transport layer to which the doping material is added, more preferable content is a value within the range of about 3 to 25% by mass, and most preferable content is a value within the range of about 5 to 15% by mass.

(Electron-Injecting Layer)

In the organic EL element 10, the electron-injecting layer (electron buffer layer) maybe disposed between the second electrode 23 and the light-emitting layer, or between the second electrode 23 and the electron transport layer. The electron-injecting layer is disposed between the second electrode 23 and the organic compound layer (light-emitting layer or electron transport layer) in order to reduce a driving voltage and to enhance an emission luminance of the organic EL element 10.

Here, although the detailed explanation of the configuration of the electron-injecting layer is omitted, the specific configuration of the electron-injecting layer is described in detail, for example, in volume 2, chapter 2 "Electrode materials" (pp. 123-166) of "Organic EL Elements and Industrialization Front thereof" (Nov. 30, 1998, published by N.T.S. Co. Ltd.).

[Second Electrode]

The second electrode 23 (cathode) is an electrically conductive film to supply (inject) the electron to the light-emitting layer, and is generally formed by an electrode material such as a metal (electron injective metal), an alloy, an electrically conductive compound, and a mixture thereof, all of which have a small work function (4 eV or less).

Specifically, in the organic EL element 10, when light is not taken out from the second electrode 23 side, the second electrode 23 is preferably made of a metal or a metal alloy such as aluminum, sodium, lithium, silver, indium, an earth metal, sodium-potassium alloy, magnesium-silver alloy, magnesium-copper alloy, magnesium-silver alloy, magnesium-aluminum alloy, magnesium-indium alloy, lithium-aluminum alloy, because of low electric resistance, and there may also be used a transparent metal oxide material such as ITO (indium tin oxide), tin oxide ($SnO_2$), zinc oxide (ZnO), gallium zinc oxide (GZO), or indium gallium zinc oxide (IGZO).

A thickness of the second electrode 23 varies depending on the layer configuration, the electric resistance of the material to be formed, or light transmittance, and is preferably set by a value within the range of 5 to 500 nm. When the thickness is 5 nm or less, a necessary electric conductivity cannot be obtained, and when the thickness is 500 nm or more, it is not preferable from the economical and productive points of view. When light is taken out from the second electrode 23 side, the second electrode made of a metal oxide having a high transparency is used, or the second electrode is used in a state of being a thin film having a thickness of the metal or alloy of 5 to 50 nm.

[Lead-Out Wiring]

Since the first electrode 21 and the second electrode 23 are made of the metal or the like lacking in moisture resistance, the lead-out wiring 14 is an electrically conductive wiring which has heat resistance and moisture resistance and which is taken out from the inorganic sealing layer 15, in order to avoid the electrode corrosion. A total thickness is preferably 50 to 1000 nm. When the thickness is 50 nm or less, wiring resistance becomes large, and when the thickness is 1000 nm or more, clacks are easily generated at the time of folding.

Examples of the materials of the lead-out wiring 14 include: a metal such as aluminum, titanium, molybdenum, copper or tantalum; or a transparent metal oxide such as ITO (indium tin oxide), indium gallium zinc oxide (IGZO), tin oxide ($SnO_2$), zinc oxide (ZnO), or GZO (gallium zinc oxide), but the metallic material advantageous in terms of electric conductivity is more preferable. The material may be used in the form of a single layer, or in the form of a metal multi-layered film such as a MAM electrode (Mo/Al.Nd alloy/Mo) of three-layered construction.

[Inorganic Sealing Layer]

The inorganic sealing layer 15 is disposed in order to prevent moisture absorption and degradation of the first electrode 21, the organic functional layer 22, and the second electrode 23. Note that the inorganic sealing layer 15 is preferably made of an insulating inorganic compound so as to avoid the short circuit between the lead-out wiring 14 and the metal layer 17, and to ensure water resistance of the side surface even when the end portion is exposed at the time of cutting. The inorganic sealing layer 15 is disposed so as to cover the second electrode 23, and forms a tight sealing form composed of the inorganic sealing layer 15, the gas barrier layer 12 and the lead-out wiring 14, by making contact with the gas barrier layer 12 in the periphery of the side surfaces while covering the side surfaces of the organic functional layer 22 and the second electrode 23.

An arbitrary material can be used as a material for forming the inorganic sealing layer 15 as long as the material can isolate the organic EL element 10 from, for example, water, oxygen or the like which deteriorates the organic EL element 10, and is a dense and high electric insulating inorganic compound.

The inorganic sealing layer 15 is preferably made of a film having both of gas barrier property and electric insulation as properties, in which a water vapor transmission rate is about 0.01 g/[m$^2$·day·atm] or less, preferably a water vapor transmission rate is about 0.0001 g/[m$^2$·day·atm] or less, and a resistivity is $1\times10^{12}$ Ω·cm or more.

There can be used, as a material for forming the inorganic sealing layer 15 having the above properties, an inorganic compound such as silicon oxide, silicon nitride, silicon oxide nitride, silicon oxide carbide, aluminum oxide, aluminum nitride, titanium oxide, niobium oxide, or zirconium oxide, or a carbon compound such as DLC (diamond dry carbon). In the present embodiment, the inorganic sealing layer 15 is preferably configured to mainly contain a silicon compound such as silicon nitride or silicon oxide in consideration of the gas barrier property, transparency, easy cutting at the time of division, and the like.

Furthermore, it is also necessary for the inorganic sealing layer 15 to have durability against pressing force in order to avoid the short circuit between the metal layer 17 and the lead-out wiring 14. Accordingly, the inorganic sealing layer 15 has preferably a Vickers hardness (JIS 22244) of HV400 or more. The short circuit can be completely avoided by making the hardness of the inorganic sealing layer 15 higher than aluminum (HV about 50), duralumin (HV150), titanium foil (HV100 to 150), copper foil (HV50 to 100), phosphorous bronze foil (HV210), SUS304 (HV200 to 300), and invar material (HV130 to 250), all of which are appropriately used for the metal layer 7.

Note that a thickness of the inorganic sealing layer 15 is appropriately set depending on a condition, but is preferably at least 200 nm or more. When the thickness is less than 200 nm, not only a short circuit easily takes place between the sealing substrate 19 and the lead-out wiring 14 at the folding of the end portion of the sealing substrate, but also pinholes and coverage failure are easily generated in the inorganic sealing layer 15 by particles and level difference between respective layers. In addition, when the resin adhesive layer 16 is softened and permeates through the second electrode 23 and the organic functional layer 22 via the pinholes, the second electrode 23 and the organic functional layer 22 are oxidized and degraded by the ingredients of the resin adhesive layer 16, thereby serving as a factor of increasing the dark spots. On the other hand, the upper limit of the thickness of the inorganic sealing layer 15 is not particularly limited as long as the insulation and push-in resistance are ensured, and is preferably 1000 nm or less in consideration of the flexibility and productivity.

[Resin Adhesive Layer]

Examples of the adhesives used for the resin adhesive layer 16 include a photo curable or thermosetting type adhesive such as an acrylic acid-based oligomer, methacrylic acid-based oligomer having a reactive vinyl group, or the like. Furthermore, there may also be used a thermosetting epoxy-based adhesive obtained by using an amine-based or an acid anhydride-based cationic polymerization curing agent, an urethane resin-based adhesive which includes an isocyanate curing agent, a moisture curable type adhesive such as cyanoacrylate, an ion cross-linkable adhesive which contains an acidic group and a metal ion salt-containing group, or the like. Moreover, there may also be used a hot melt-type adhesive including a polyamide, a polyester, a polyolefin such as a polyethylene, and a thermoplastic resin, all of which are softened at a high temperature; an adhesive having an initial tackiness at room temperature; and a pressure-sensitive adhesive which is softened by pressurization. Other than these, there may also be used, as the adhesive, an ultraviolet curable-type epoxy resin adhesive of cationic curable-type.

A thickness of the resin adhesive layer 16 is preferably 5 to 50 μm. When the thickness is less than 5 μm, the level difference of each layer is insufficiently covered and the adhesive force of each layer is not sufficient, and when the thickness is more than 50 μm, economical efficiency deteriorates.

In addition, a water content of the resin adhesive layer 16 is preferably about 1.0% or less in consideration of the lowering of an amount of an outgas generated at the time of lamination, and life prolongation of the organic EL element 10, or the like. Note that the water content mentioned here is a value measured in accordance with the method defined in ASTM (American Society for Testing and Materials)—D570.

In the resin adhesive layer 16, there may be added, as an additive, a silane coupling agent that enhances an interface adhesive force, and filler particles such as organic resin beads or particles of inorganic compound, which enhances rigidity and moistureproofness. A particle size of the filler particles to be added is preferably 10 μm or less in diameter so that the particle may not protrude as a protruding object and break the inorganic sealing layer 15. More preferably, retardation effect of gas permeation is expected through the use of a nano-sized particle within the particle size range of 10 to 1000 nm.

[Metal Layer]

The metal layer 17 has roles to play in protecting the inorganic sealing layer 15, imparting moistureproofness to the inorganic sealing layer 15, imparting heat releasing and thermal diffusion property at the time of light emission of the organic EL element 10, and protecting the resin adhesive layer 16. In addition, since the metal layer is required to be deformed and kept so as to cover the edge portion of the resin adhesive layer 16, the layer needs to have an appropriate rigidity and hardness. When, as the properties of the material of the metal layer 17, a Young's modulus (JIS 22241) is set to 30 to 200 GPa, and a Vickers hardness (JIS 22244) is set to HV10 to 250, the electric short circuit can be reliably avoided without penetrating through the inorganic sealing layer 15, and furthermore the edge covering of the resin adhesive layer 16 can be completely obtained by keeping the deformation at the time of lamination. In addition, in order to obtain a heat release property, a thermal conductivity of the metal layer 17 is preferably 5 W/m·k or more.

Specific examples of the materials of the metal layer 17 include an aluminum foil, a duralumin foil, a titanium foil, a copper foil, a phosphorous bronze foil, a SUS304 foil, an invar foil, a magnesium alloy foil, and the like. In the following Table 1, materials suitable for the metal layer 17 and properties thereof are shown.

TABLE 1

|  | Young's modulus (GPa) | Vickers hardness (HV) |
|---|---|---|
| Aluminium foil | 70 | HV50 |
| Duralumin foil | 80 | HV150 |
| Titanium foil | 110 | HV100~150 |
| Copper foil | 130 | HV50~100 |
| Phosphorous bronze foil | 110 | HV120~210 |
| SUS304 foil | 200 | HV200~250 |
| Invar foil | 140 | HV130~250 |
| Magnesium alloy foil | 50 | HV35~100 |

A thickness of the metal layer 17 is preferably 20 to 50 μm. When the thickness is less than 20 μm, it is not possible to maintain the deformation state, and when the thickness is 50 μm or more, it becomes difficult to easily deform the metal layer 17 due to low flexibility.

[Insulation Layer]

In the sealing substrate 19, the insulation layer 18 is formed on a side opposite to the resin adhesive layer 16 of the metal layer 17, and in the organic EL element 10, is arranged facing the substrate 11. The insulation layer 18 is formed in order that the insulation performance may be ensured between the metal layer 17 and the lead-out wiring 14 of the organic EL element 10 or the external equipment to be connected to the lead-out wiring 14. Accordingly, the insulation layer 18 preferably has an electric resistance of $1 \times 10^{12}$ Ω·cm or more. In addition, in order to carry out deformation and maintenance by following the metal layer 17, the insulation layer preferably has flexibility and a Young's modulus lower than the metal layer 17, specifically, a Young's modulus of 10 GPa or less.

A resin having flexibility is suitable as the specific material of the insulation layer 18, and examples thereof that can be used include a polyolefin such as polyethylene, polypropylene or a cyclic olefin copolymer (COP), a polyester such as polyamide, polyimide, polyethylene terephthalate (PET) or polyethylene naphthalate (PEN), a cellulose ester such as cellophane, cellulose diacetate, cellulose acetate butyrate, cellulose acetate propionate (CAP), cellulose triacetate (TAC) or cellulose nitrate, polyvinylidene chloride, polyvinyl alcohol, polyethylene vinyl alcohol copolymer (EVOH), syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, fluororesin, a polyacrylate such as polymethyl methacrylate (PMMA), polyarylates and a derivative thereof. In addition, there can also be used a cycloolefin resin such as ARTON (registered trade mark: manufactured by JSR Co. Ltd.) or APEL (registered trade mark: manufactured by Mitsui Chemicals, Inc.).

A thickness of the insulation layer 18 is preferably smaller than the metal layer 17 in order that the deformation state of the metal layer 17 may be required to be maintained. Specifically, a suitable thickness is 4 to 30 μm. When the thickness is less than 4 μm, it is not possible to ensure a sufficient insulating property, and when the thickness is 30 μm or more, it becomes difficult to maintain the deformation of the sealing substrate 19 due to increase in rigidity.

<Organic Electroluminescent Element (Second Embodiment)>

Figure 5:
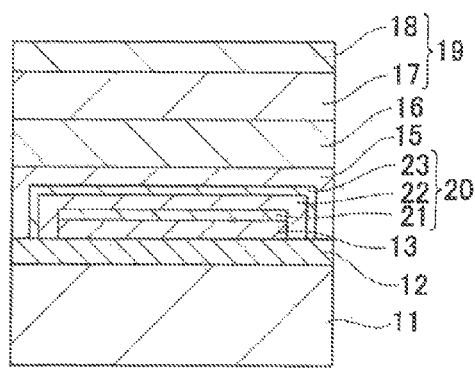
FIG. 5 is an X-X line cross-sectional view of the organic EL element according to the second embodiment shown in FIG. 4.
Figure 6:
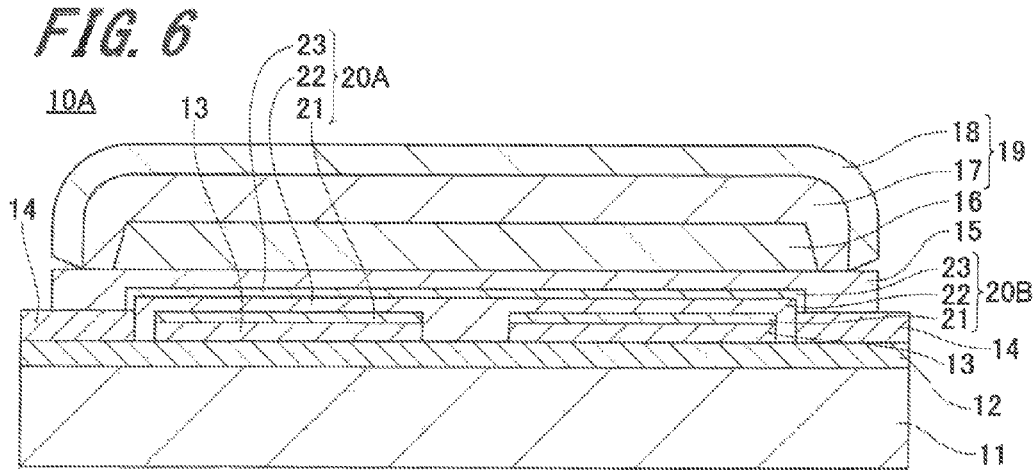
FIG. 6 is a Y-Y line cross-sectional view of the organic EL element according to the second embodiment shown in FIG. 4.

Next, The second embodiment of the organic electroluminescent element (organic EL element) will be explained. The configuration of the organic EL element of the second embodiment is shown in FIGS. 4 to 6. FIG. 4 is a plane view showing a schematic configuration of the organic EL element. FIG. 5 is an X-X line cross-sectional view of the organic EL element shown in FIG. 4. In addition, FIG. 6 is a Y-Y line cross-sectional view of the organic EL element shown in FIG. 4.

[Configuration of Organic EL Element]

As shown in FIG. 4, an organic EL element 10A has a configuration in which a first light-emitting part 20A and a second light-emitting part 20B which serve as the light-emitting parts of the organic EL element 10A are sealed between the substrate 11 and the sealing substrate 19. In addition, the organic EL element 10A has the lead-out wiring 14 led out from the first light-emitting part 20A and the second light-emitting part 20B to the outside of the sealing substrate 19.

Additionally, in the organic EL element 10A shown in FIG. 4, the element has two light-emitting parts, i.e. the first light-emitting part 20A and the second light-emitting part 20B, and the lead-out wirings 14 are arranged at the mounting sides facing each other of the substrate 11.

In addition, as shown in FIG. 6, each of the lead-out wirings 14 is connected to the respective second electrode 23 of the first light-emitting part 20A and the second light-emitting part 20B, on the substrate 11. Additionally, the lead-out wiring 14 is led out outside the inorganic sealing layer 15 and the sealing substrate 19 on the substrate 11.

As described above, the same configuration as that of the above-described first embodiment can be applied except that the organic EL element 10A according to the second embodiment has the first light-emitting part 20A and the second light-emitting part 20B and the lead-out wiring 14 is disposed thereto, respectively. Accordingly, the cross-section of the organic EL element 10A not having a mounting side as shown in FIG. 5 has the same configuration as that of the above-described first embodiment, shown in FIG. 2.

In addition, in FIG. 6, only the arrangements of the first light-emitting part 20A, the second light-emitting part 20B and the lead-out wiring 14, and the shape of the edge of the sealing substrate 19 are different from those in the cross-sectional view of the first embodiment shown in FIG. 3. Therefore, the same configuration as that of the organic EL element of the first embodiment can be applied to the configuration of the organic EL element 10A of the second embodiment.

The lead-out wiring 14 is led out outside the inorganic sealing layer 15 and the sealing substrate 19, on the substrate 11. Note that, although not shown in FIG. 6, the lead-out wiring 14 connecting to the first electrode 21 is disposed, and is led out outside the inorganic sealing layer 15 and the sealing substrate 19.

In addition, as shown in FIGS. 4 and 6, the lead-out wirings 14 are led out from the both sides of the substrate 11. As described above, the organic EL element 10A is mounted on external equipment in the directions of both mounting sides where the lead-out wiring 14 is led out. At the mounting side where the lead-out wiring 14 of the organic EL element 10A is arranged, the lead-out wiring 14 serves as an electrode for connecting to the external equipment by exposure of the lead-out wiring 14 from the sealing substrate 19.

Furthermore, as shown in FIG. 6, the edge of the sealing substrate 19 is folded to the substrate 11 side, at the mounting side where the lead-out wiring 14 is formed. Namely, in FIG. 6, the sealing substrate 19 is folded to the substrate 11 side, at the both edges where the lead-out wiring 14 is formed.

In addition, the both edges of the sealing substrate 19 are in contact with the upper surface of the inorganic sealing layer 15. As described above, the sealing substrate 19 is folded at both edges serving as the mounting side, and the end surfaces of the resin adhesive layer 16 are constituted so as not to be exposed to the mounting side by contact with the inorganic sealing layer 15.

As in the second embodiment, also in a case where a plurality of the light-emitting parts is disposed, since the edge portion of the sealing substrate 19 is folded to make contact with the inorganic sealing layer 15 at the mounting side where the lead-out wiring 14 is formed, the resin adhesive layer 16 can be constituted so as not to be exposed to the mounting side. Accordingly, it is possible to prevent the outflow of the resin adhesive layer 16 to the mounting side, to eliminate contamination of the electrode for connecting to the external equipment, and to enhance the electrical connection reliability of the organic EL element 10A with the external equipment.

As described above, also in the organic EL element that has a plurality of the light-emitting parts and that is provided with a plurality of lead-out wirings at plural places, it is possible to obtain the same effect as in the above first embodiment by using the configuration in which the edge portion of the sealing substrate is folded to thereby not expose the resin adhesive layer, depending on the place where the lead-out wiring is disposed. Furthermore, it is possible to constitute the organic EL element having the same effects by applying the same configuration as that of the first embodiment described above.

<3. Method for Producing Organic Electroluminescent Element (Third Embodiment)>

Next, a method for producing the organic EL element of the above first embodiment and the second embodiment will be explained.

FIGS. 7 to 16 show producing process diagrams of the organic EL element of the above first embodiment and the second embodiment.

FIGS. 7 to 9 and FIGS. 10 to 12 are diagrams showing the pressure-bonding process where the sealing substrate are joined, via resin adhesive layer, to the organic EL element on which the layers up to the inorganic sealing layer are formed.

Figure 13:
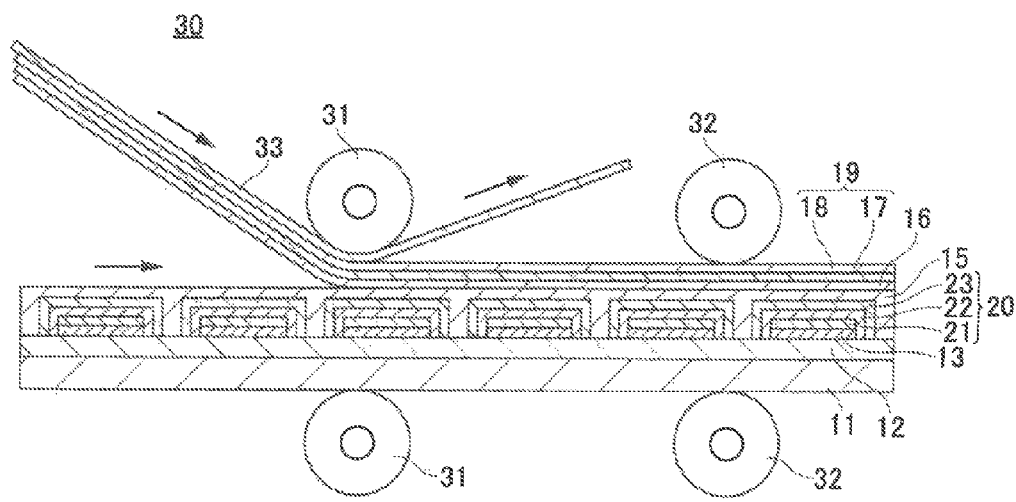
FIG. 13 is a diagram showing an example of configuration of a roll laminating machine that performs the pressure-bonding process.
Figure 14:
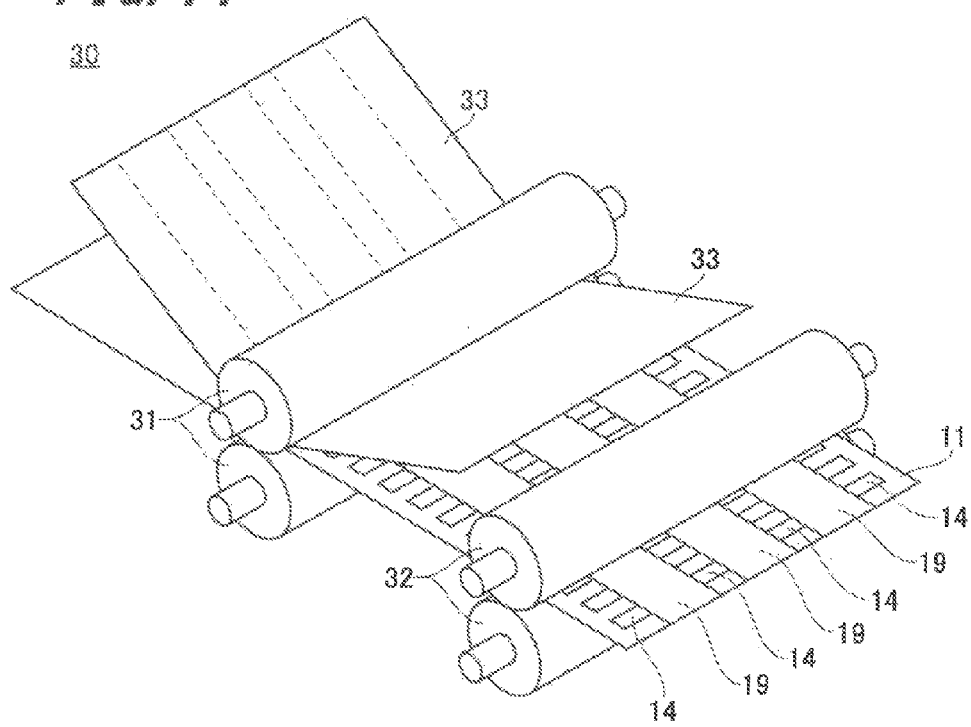
FIG. 14 is a diagram showing an example of configuration of a roll laminating machine that performs the pressure-bonding process.

In addition, FIGS. 13 and 14 are diagrams showing an example of configuration of a roll laminating machine that performs the pressure-bonding process.

Figure 15:
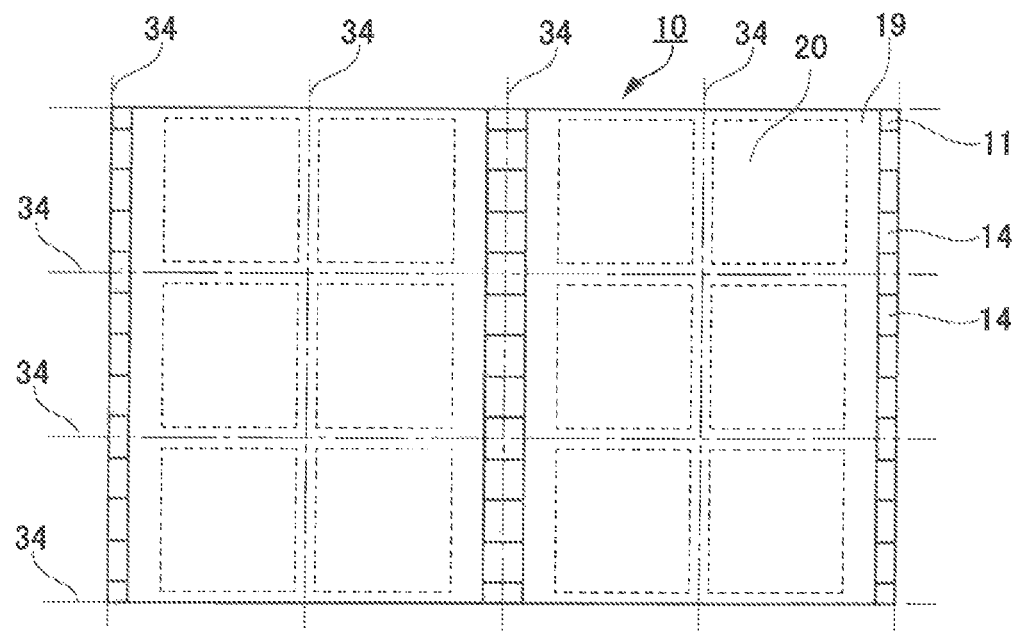
FIG. 15 is an explanatory diagram of a process for cutting the organic EL element into pieces of element.
Figure 16:
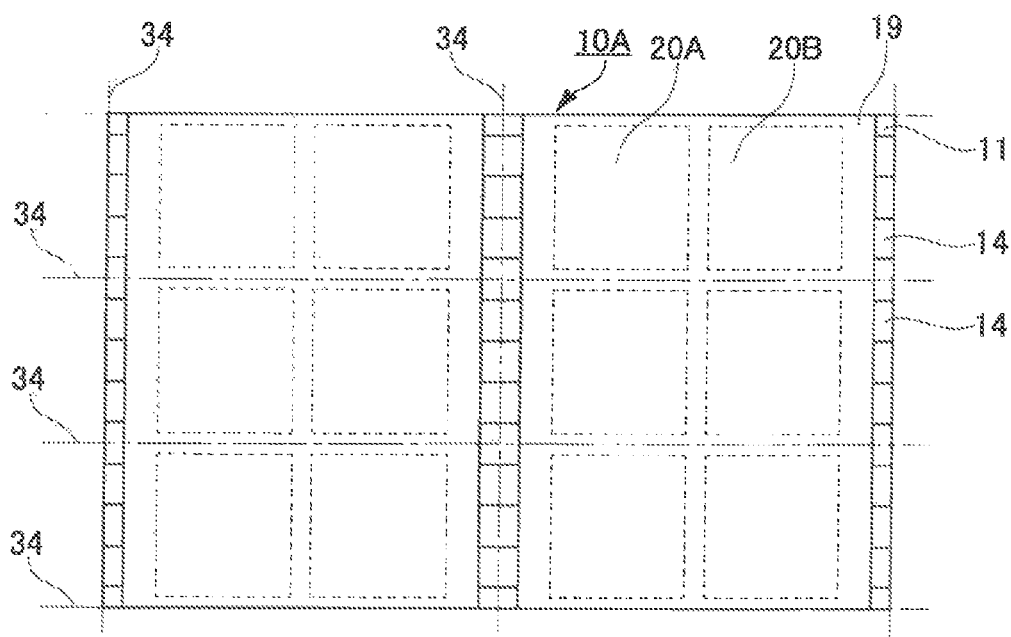
FIG. 16 is an explanatory diagram of the process for cutting the organic EL element into pieces of element.

FIGS. 15 and 16 are explanatory diagrams of the process for cutting a plurality of the organic EL elements formed on a rolled substrate, into pieces of element.

[Gas Barrier Layer—Llight-Emitting Part—Inorganic Sealing Layer]

(Gas Barrier Layer)

First, the gas barrier layer 12 is formed on the substrate 11. A well-known method can be applied to the formation of the gas barrier layer as long as the layer can be formed on the substrate 11. Example of the method that can be used include a method such as a vacuum deposition method, a spattering method, magnetron spattering method, molecular beam epitaxial method, cluster-ion beam method, an ion plating method, a plasma polymerization method, an atmospheric pressure plasma polymerization method (Japanese Patent Laid-Open No.2004-68143), a plasma CVD (Chemical Vapor Deposition) method, a laser CVD method, a thermal CVD method, an ALD (Atomic Layer Deposition) method, or a wet coating.

(Base Layer)

Next, the base layer 13 is formed on the gas barrier layer 12, at the portion where the first electrode 21 is formed. There can be used, for the formation of the base layer 13, a dry process such as vapor deposition, or a wet process such as spray coating, a gravure coater, a comma coater, a die coater, or an ink-jet method. The base layer 13 is pattern-formed into the same shape as that of the first electrode 21.

(First Electrode)

Next, the first electrode 21 is formed on the base layer 13. The first electrode 21 can be formed by a method such as a vacuum deposition method, a spattering method, a magnetron spattering method, a molecular beam epitaxial method, a cluster-ion beam method, an ion platting method, a plasma polymerization method, or a wet coating.

Furthermore, the first electrode 21 is formed into a desired pattern by using a pattern mask opened in a desired shape pattern. The first electrode 21 is formed into a pattern having one or more connections to the lead-out wiring 14.

(Organic Functional Layer)

Next, the organic functional layer 22 is formed so as to cover the base layer 13 and the first electrode 21 . As described above, the organic functional layer 22 is formed by plural layers, and in the following description, a method for forming the positive hole transport layer, the light-emitting layer, and the electron transport layer will be explained in this order, as one example of the organic functional layer 22.

The positive hole transport layer can be formed by the vacuum vapor deposition method. A film thickness of the positive hole transport layer is set depending on the condition of, for example, the positive hole transport material, or the like, but it is preferable to set a value within the range of 5 to 500 nm. Note that the positive hole transport layer may be a single layer or multiple layers . When forming the positive hole layer is a single layer, one or two or more kinds of the materials of the positive hole transport materials may be included in the positive hole transport layer.

The light-emitting layer can be formed by vacuum vapor deposition method. Note that a thickness of the light-emitting layer may be arbitrarily set, and it is preferable to set a value of a thickness of the light-emitting layer within the range of 5 nm to 200 nm from the viewpoints of homogeneous property of the film, prevention of application of an unnecessary high voltage at the time of light emission, and improvement of stability of emitted light relative to a driving current, and the like.

The electron transport layer can be formed by the vacuum vapor deposition method. In addition, a film thickness of the electron transport layer is appropriately set depending on the condition of, for example, the electron transport material or the like, but it is preferable to set a value within the range of 5 to 200 nm. Note that the electron transport layer may be a single layer or multiple layers. When forming the electron layer is a single layer, one or two or more kinds of the materials of the electron transport materials described above may be included in the electron transport layer.

(Second Electrode)

Next, the second electrode 23 is formed so as to cover the organic functional layer 22. The second electrode 23 can be formed in the same way as the first electrode 21 described above. The second electrode 23 can be formed by a method such as a vacuum deposition method, a spattering method, a magnetron spattering method, a molecular beam epitaxial method, a cluster-ion beam method, an ion platting method, a plasma polymerization method, or a wet coating.

Furthermore, the second electrode 23 is formed so as to have a desired pattern by using a pattern mask opened in a desired shape pattern. The second electrode 23 is formed so as to have a pattern having one or more connections to the lead-out wiring 14.

(Lead-Out Wiring)

Subsequently, the lead-out wiring 14 connected to the first electrode 21 and the second electrode 23 described above is formed. The lead-out wiring is formed by, for example, vacuum vapor deposition, spattering method, ion plating method, or the like. Furthermore, the lead-out wiring 14 is formed so as to have the pattern of connecting to the first electrode 21 or the second electrode 23, and then, the lead-out wiring 14 extends to the outside of the inorganic sealing layer 15, and is formed so as to have the pattern serving as an electrode for connecting to the external equipment.

Note that the formation process of the lead-out wiring 14 is not limited after formation of the second electrode 23, but, for example, the lead-out wiring 14 may be previously formed before formation of the first electrode 21 on the substrate 11. Also in this case, the above-described method can be applied. In addition, in a case of previously forming the lead-out wiring 14 before formation of the first electrode 21, the first electrode 21 and the second electrode 23 are formed so as to have the pattern that electrically connects to the lead-out wiring 14.

(Inorganic Sealing Layer)

Then, the inorganic sealing layer 15 that covers the light-emitting parts 20A and 20B is formed.

The inorganic sealing layer 15 can be formed by a known method such as, for example, vacuum deposition method, spattering method, magnetron spattering method, molecular beam epitaxial method, cluster-ion beam method, ion plating method, plasma polymerization method, atmospheric pressure plasma polymerization method, plasma CVD method, laser CVD method, or thermal CVD method.

The inorganic sealing layer 15 is formed so as to have a pattern to cover the second electrode 23, and furthermore is so formed as to have a pattern to cover side surfaces of the organic functional layer 22 and the first electrode 21. Then, the inorganic sealing layer is formed so as have a pattern that makes contact with the lead-out wiring 14 and the gas barrier layer 12 around the first electrode 21, the organic functional layer 22 and the second electrode 23. Accordingly, the tight sealing structure made of the inorganic sealing layer 15, the gas barrier layer 12 and the lead-out wiring 14 is formed.

[Production of Sealing Substrate]

Next, the sealing substrate 19 is joined to the organic EL element where the layers up to the inorganic sealing layer 15 are formed.

First, the sealing substrate 19 is formed. The sealing substrate 19 can be formed by directly coating the insulation layer 18 on one surface of the metal layer 17. Alternatively, the insulation layer 18 maybe formed by extruding an insulation substance on the metal layer 17 while dripping the same in the form of curtain through the use of a heat-melting extrusion method. Furthermore, an insulation layer 18 previously formed into a state of film may be bonded to the metal layer 17 by an adhesive layer (not shown).

Next, the resin adhesive layer 16 is formed on the sealing substrate 19. The resin adhesive layer 16 is formed by directly coating the resin adhesive layer 16 on the surface of the metal layer 17, or by sticking a resin adhesive layer 16 having previously formed to the surface of the metal layer 17.

From the viewpoint of simplicity of the production process of the organic EL element, it is preferable to form the resin adhesive layer 16 by using a heat curable adhesive which contains a thermal polymerization initiator.

In addition, the sealing substrate 19 is formed so that an area of the resin adhesive layer 16 is formed smaller than the metal layer 17 so that the metal layer 17 is exposed, at the mounting side where the lead-out wiring 14 is formed.

[Pressure-Bonding Process of Sealing Substrate]

Next, the sealing substrate 19 is crimped on the inorganic sealing layer 15 via the resin adhesive layer 16. FIGS. 7 to 9 and FIGS. 10 to 12 are views schematically showing the processes in which the sealing substrate 19 is crimped on the inorganic sealing layer 15.

Figure 7:
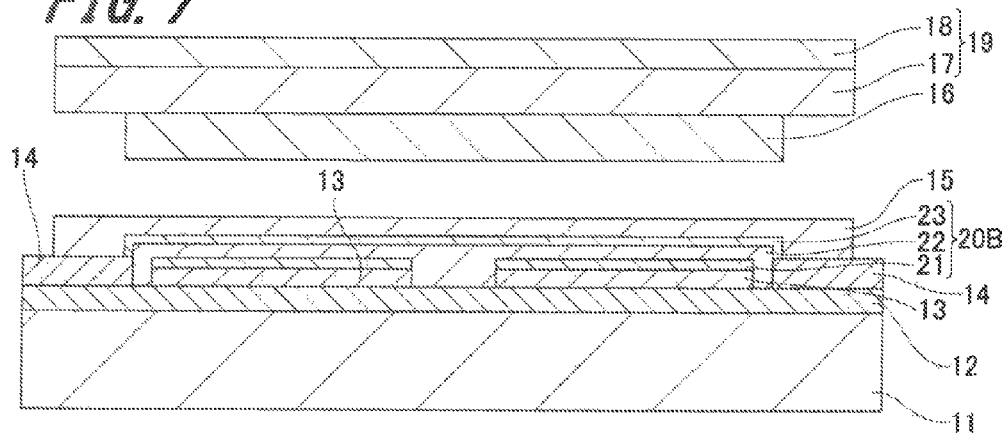
FIG. 7 is a diagram showing a pressure-bonding process of the organic EL element according to the second embodiment.
Figure 8:
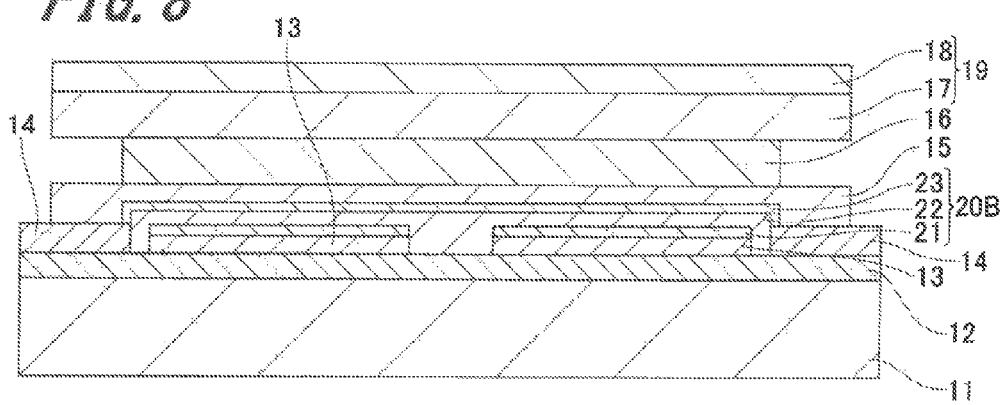
FIG. 8 is a diagram showing the pressure-bonding process of the organic EL element according to the second embodiment.
Figure 9:
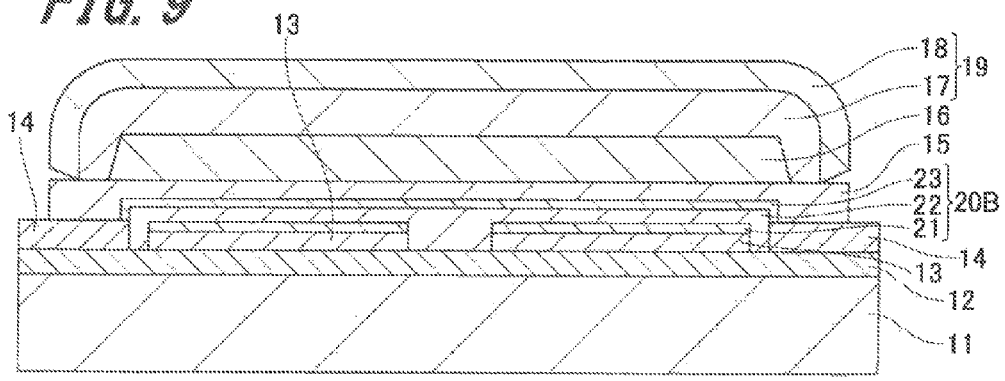
FIG. 9 is a diagram showing the pressure-bonding process of the organic EL element according to the second embodiment.

FIGS. 7 to 9 show cases where the insulation layer 18 and the metal layer 17 are formed so as to have the same width, and only the resin adhesive layer 16 is formed so as to have a smaller area than those (for example, each of both edge portions being smaller by about 0.1 mm width).

FIGS. 10 to 12 show cases where the metal layer 17 is formed so as to have a smaller area than the insulation layer 18 (for example, each of the both edge portions being smaller by about 0.1 mm width), and the resin adhesive layer 16 is formed so as to have a smaller area than the metal layer 17 (for example, each of both edge portions being smaller by about 0.1 mm width), and then the edge portions of the metal layer 17 are completely covered by the insulation layer 18.

Specifically, the form shown in FIGS. 7 to 9 can be obtained by coating the resin adhesive layer 16 on the insulation layer 18 and the metal layer 17 so as to have an area that is one size smaller. In addition, the width of each layer may be changed through cutting each layer by irradiation with a laser having a different wavelength after laminating the three layers.

Furthermore, in case of the shape shown in FIGS. 10 to 12, in consideration of the productivity, it is also possible to gradually make each layer have a wide pattern by using a laser or a mechanical blade from the resin adhesive layer 16 side and by cutting each layer. For example, it is possible to form each layer so that the edge portion of each layer becomes gradually wide, by irradiation with a carbon oxide gas laser, a YAG laser or the like so as to form a focus angle, or by pushing a blade having a tapered angle.

First, as shown in FIGS. 7 and 10, the sealing substrate 19 on which the resin adhesive layer 16 has been formed is directly faced to a predetermined position with respect to the organic EL element in which the layers up to the inorganic sealing layer 15 have been formed.

Next, the sealing substrate 19 is crimped on the inorganic sealing layer 15. The pressure-bonding process is preferably carried out by dividing into two stages.

In a first pressure-bonding process, as shown in FIG. 8 and FIG. 11, the resin adhesive layer 16 is brought into contact with the surface of the inorganic sealing layer 15.

In a second pressure-bonding process, as shown in FIG. 9 and FIG. 12, the edge portion of the sealing substrate 19 is folded to the substrate 11 side, on the mounting side where the lead-out wiring 14 is formed. Accordingly, the sealing substrate 19 is made in the form in which the sealing substrate covers the side surface of the resin adhesive layer 16.

When the pressure-bonding process is carried out in the divided two stages, the inorganic sealing layer can be bonded together at a high temperature under a high pressure so as to obtain sufficient flowability without flowing out the resin adhesive later 16, by, in the first pressure-bonding process, sticking together the resin adhesive layer 16 so as not to protrude from the sealing substrate 19 at a low temperature under a low pressure, and by, in the second pressure-bonding process, deforming the sealing substrate 19 to thereby cover the side surface of the resin adhesive layer 16

[Laminating Machine]

Next, a machine for carrying out the above two stages of pressure-bonding process will be explained. FIGS. 13 and 14 are diagrams showing an example of a roll laminating machine for carrying out the two stages of pressure-bonding process.

In a roll laminating machine 30 shown in FIGS. 13 and 14, a pair of first crimp rolls 31 which sandwich the organic EL element are disposed on the upstream side of the process, and a pair of second crimp rolls 32 which sandwich the organic EL element are disposed on the downstream side of the process.

In the roll laminating machine 30, the sealing substrate 19 and the resin adhesive layer 16 are continuously fed in the form of roll in a state of being previously cut into a predetermined form and being temporally fixed to a separator 33. The above first pressure-bonding process is carried out by the first crimp rolls 31, and the second pressure-bonding process is carried out by the second crimp rolls 32.

In the first pressure-bonding process, the laminating procedure is carried out by the first crimp rolls 31 at a low temperature under a low pressure to the extent that the resin adhesive layer 16 does not protrude from the sealing substrate 19. In addition, in the second pressure-bonding process, the edge portion of the sealing substrate 19 is folded to the substrate 11 side by the second crimp rolls 32, and the laminating procedure is carried out at a high temperature under a high pressure so as to obtain sufficient flowability of the resin adhesive layer 16. It is preferable that the second crimp rolls 32 have an elastic surface in order to bend the edge portion of the sealing substrate 19 to the substrate 11 side.

Since the above-described roll laminating machine 30 has a high productivity since the continuous roll lamination can be performed. The pressure-bonding environment of the roll laminating machine 30 is preferably an inert gas atmosphere such as nitrogen gas in order to suppress mixing of air and water, and more preferably an ideal pressure-bonding state without bubble can be obtained under a reduced pressure atmosphere.

Note that, also other than the above roll laminating machine 30, a pressure-bonding lamination of diaphragm type can be used. According to the diaphragm type, pressure-bonding can be performed on a metal hot plate by deformation of a diaphragm made of a rubber sheet, or the like through utilization of a pressure difference. In this case, the resin adhesive layer 16 is caused to adhere to the inorganic sealing layer 15 under a reduced pressure atmosphere by arranging the insulation layer 18 and the substrate 11 so as to make contact with the diaphragm side and the hot plate side, respectively, and also folding is performed by deformation of the edge portion of the sealing substrate 19. In this case, although feeding in the form of roll substrate is possible, the feeding of the substrate is stopped during the pressure-bonding process. Accordingly, the productivity is poorer than that in the roll lamination, but it becomes possible to carry out pressure-bonding process at the same time without separating the first pressure-bonding process and the second pressure-bonding process. Namely, since the sealing substrate 19 can be folded while the resin adhesive layer 16 is crimped, it becomes possible to carry out the pressure-bonding process without deteriorating the productivity.

In this way, the pressure-bonding process is finished, and then, the organic EL element in a state where the substrates 11 are connected is subjected to processes such as a thermal curing, with the result that the resin adhesive layer 16 is cured.

[Cutting]

Then, the organic EL elements in a state where the substrates 11 are connected are cut into individual pieces of the elements.

FIGS. 15 to 16 show schematic diagrams of the cutting process to individual pieces. FIG. 15 shows a cutting method for producing the organic EL element according to the above first embodiment. FIG. 16 shows a cutting method for producing the organic EL element according to the above second embodiment.

In the cutting process, each component laminated on the substrate 11 is cut along the cutting line 34 shown in FIGS. 15 to 16 and is separated from each other for each element, and thus the individual piece of the organic EL elements 10 and 10A is obtained.

At this time, as shown in FIGS. 15 to 16, surface attachment is made with the mounting side where the lead-out wiring 14 is formed and the FPC is mounted, facing each other, and thus the formation of the element having high area efficiency can be accomplished. Since the sealing substrate 19 and the resin adhesive layer 16 can be prepared in a state of stripe-like roll, the accuracy of the lamination position can be easily enhanced at the time of the preparation in a roll state and of the lamination.

Specific examples of the cutting methods include a press cutting method by using a metallic or ceramic mechanical blade, and a cutting method using laser light. Examples of the cutting by using the mechanical blade include a method of scanning a straight blade or a roll blade, a hydraulic cutting by using a guillotine cutter, a die cutting by using a Thomson blade, a pinnacle blade, or the like.

The laser cutting method can be carried out by using a light source such as excimer laser, carbon oxide gas ($CO_2$) laser, YAG laser, Nd:YAG laser, ruby laser, $YVO_4$ laser or semiconductor laser, and combining one or more kinds of lasers within the wavelength range of 0.1 to 50 μm. The cutting is carried out by arranging side by side one or plural heads and performing scanning. Furthermore, since the laminated body is made of different materials such as resins and metal foils, the laser light having a wavelength which is easily absorbable in each layer are sequentially scanned for cutting.

<4. Organic Electroluminescent Element Module (Fourth Embodiment)>

Next, the fourth embodiment of the organic electroluminescent element (organic EL element) will be explained. In the fourth embodiment, an organic EL element module in which external equipment is connected to the organic EL element of the above first embodiment or the second embodiment will be explained.

[Flexible Print Circuit Film (FPC)]

Figure 17:
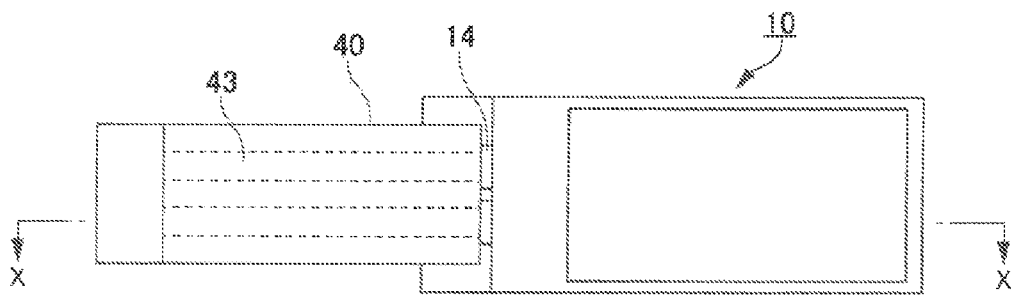
FIG. 17 is a diagram showing a configuration of the organic EL element module in a state where the flexible print circuit film (FPC) is connected.
Figure 18:
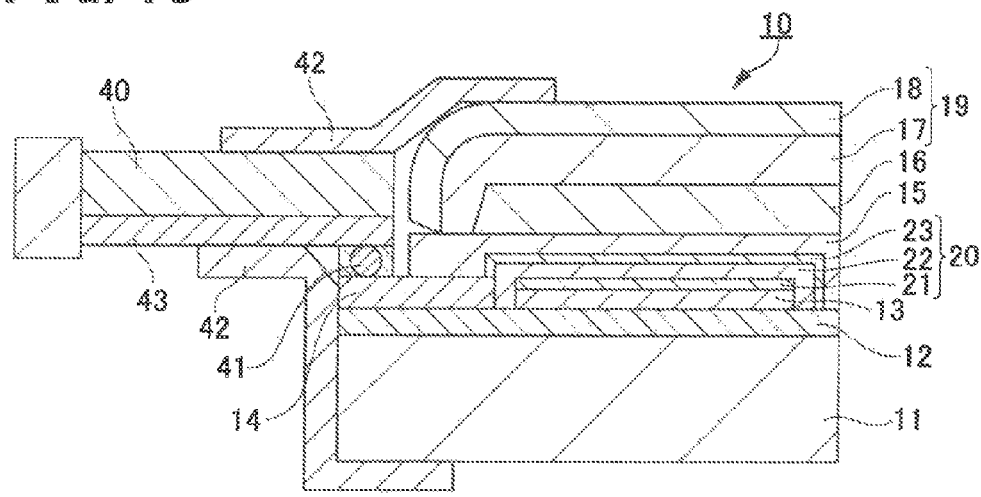
FIG. 18 is an X-X line cross-sectional view of the organic EL element module shown in FIG. 17.
Figure 19:
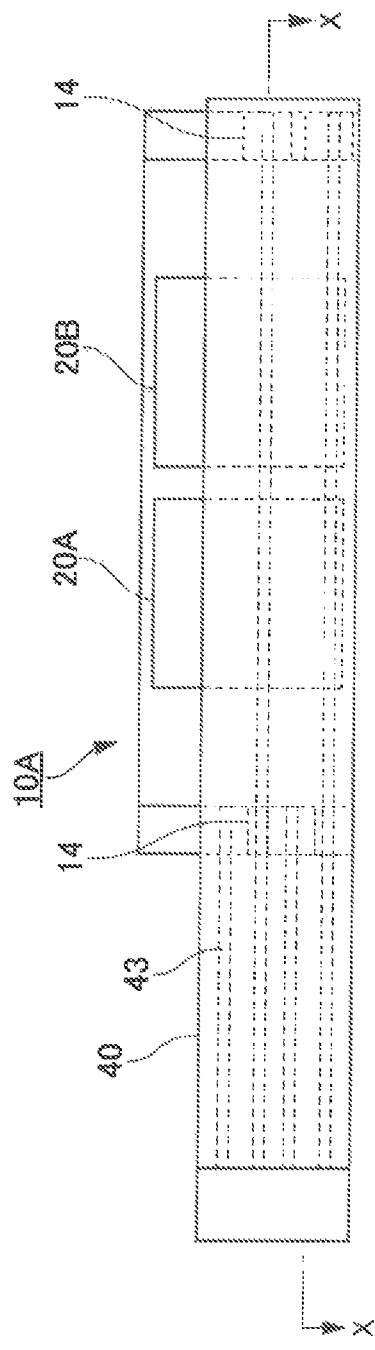
FIG. 19 is a diagram showing a configuration of the organic EL element module in a state where the flexible print circuit film (FPC) is connected.
Figure 20:
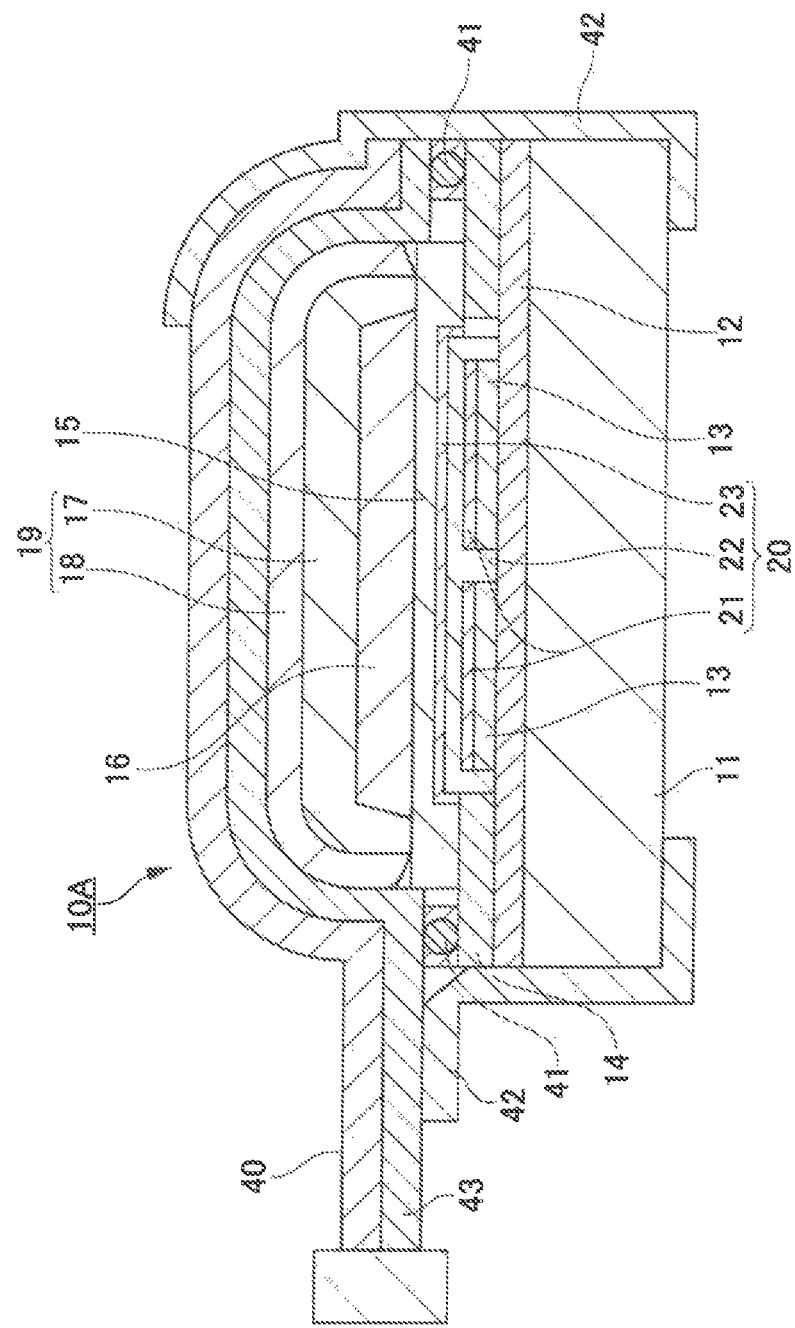
FIG. 20 is an X-X line cross-sectional view of the organic EL element module shown in FIG. 19.
Figure 21:
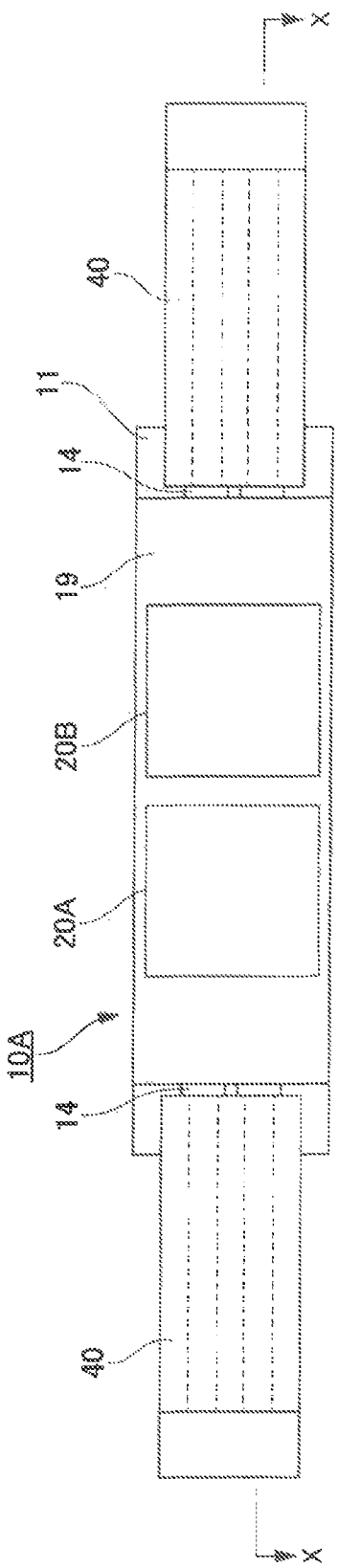
FIG. 21 is a diagram showing a configuration of the organic EL element module in a state where the flexible print circuit film (FPC) is connected.
Figure 22:
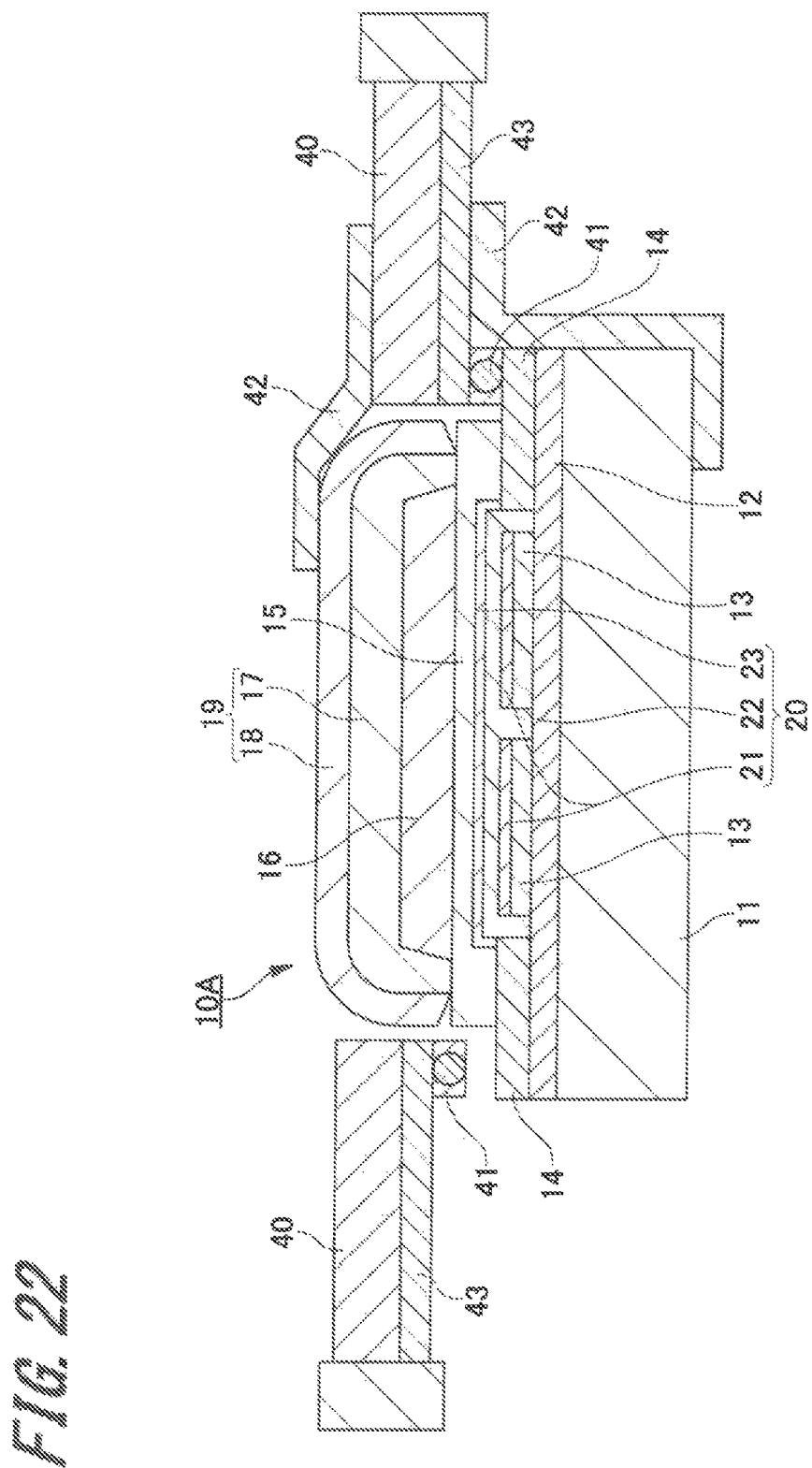
FIG. 22 is an X-X line cross-sectional view of the organic EL element module shown in FIG. 21.

FIGS. 17 to 18, FIGS. 19 to 20 and FIGS. 21 to 22 show configurations of the organic EL element modules in a state where the flexible print circuit film (FPC) is connected. FIG. 17, FIG. 19 and FIG. 21 are plane views of the organic EL element modules, and FIG. 18, FIGS. 20 and 22 are X-X line cross-sectional views of the organic EL element modules shown in FIGS. 17, 19 and 21.

FIGS. 17 to 18 show the configuration of the organic EL element module in a state where the FPC is connected to the organic EL element of the above first embodiment.

FIGS. 19 to 20 show the configuration of the organic EL element module in a state where a single FPC is connected to the organic EL element of the above second embodiment.

FIGS. 21 to 22 show the configuration of the organic EL element module in a state where plural FPCs are connected to the organic EL element of the above second embodiment.

[Pressure-Bonding and Mounting FPC]

In FIGS. 17 and 18, the external equipment by the FPC 40 is connected to the lead-out wiring 14 of the organic EL element 10 of the above first embodiment. In the example, the FPC 40 is mounted, from the same direction (mounting side), on the lead-out wiring 14 led out in one direction (mounting side) of the substrate 11. A metal wiring 43 provided on the FPC 40 is connected to the lead-out wiring 14 of the organic EL element 10 via an anisotropically conductive film (ACF) 41.

The FPC 40 is connected via a connector to a control circuit board substrate and a power unit (power supply portion). In this way, the organic EL element 10 is used as lighting device and a light-emitting device by communicating with the external control circuit, a power source and the like through the lead-out wiring 14, the metal wiring 43 of the FPC 40 and the connector.

There can be used, as the method for pressure-bonding the FPC 40 and the ACF 41, a general pressure-bonding method by heating/pressurizing. As to a pressure-bonding temperature at which the ACF 41 is melted for connection, the ACF is heated at 100 to 200° C., and thus it is preferable not to apply thermal stress to the resin adhesive layer 16 having a relatively low heat resistance.

Since the adhesion area of the FPC 40 and the ACF 41 is extremely small, it is preferable to employ a configuration of providing an insulative molding agent (not shown) so as to further cover the ACF 41, or a configuration of performing fixing with a reinforcing tape 42 so as to build a bridge between the FPC 40 and the substrate 11 or the sealing substrate 19.

In FIGS. 19 and 20, the FPC 40 is mounted, from the one direction side of the organic EL element 10A, on the lead-out wiring 14 which is led out to the both edges (both mounting sides) of the substrate 11 of the organic EL element 10A according to the above second embodiment. The FPC 40 is connected to the lead-out wiring 14 at one edge portion from one direction side of the organic EL element 10A, extends the other edge portion side along on the sealing substrate 19, and then is connected to the lead-out wiring 14 at the other end. In addition, the metal wiring 43 provided on the FPC 40 is connected to each lead-out wiring 14 via the ACF 41.

Furthermore, in the FPC 40 and the organic EL element 10A, the configuration is such that a portion between the FPC 40 and the substrate 11 is fixed by the reinforcing tape 42 on one direction side, and on the other direction, a portion between the FPC 40 and the substrate 11, and a portion between the FPC 40 and the sealing substrate 19 are fixed by the reinforcing tape 42.

In this way, it maybe possible to employ a configuration in which external equipment is connected to a plurality of lead-out wirings 14 disposed on the different mounting sides by using the single FPC 40.

In FIGS. 21 and 22, two FPCs 40 are mounted, from the both mounting sides of the organic EL element 10A, on the lead-out wirings 14 which is led out to the both edges (mounting sides) of the substrate 11 of the organic EL element 10A according to the above second embodiment.

In this example, the FPCs 40 are mounted, from the front direction (each mounting side), on the lead-out wirings 14 led out to the both directions (both mounting sides) of the substrate 11. In addition, the metal wiring 43 provided on each FPC 40 is connected to the lead-out wiring 14 of the organic EL element 10A by the anisotropically conductive film (ACF) 41.

Furthermore, in the FPC 40 and the organic EL element 10A, the configuration is such that a portion between the FPC 40 and the substrate 11, and a portion between the FPC 40 and the sealing substrate 19 are fixed by the reinforcing tape 42 at the both mounting sides.

As explained above, it may be possible to employ a configuration in which external equipment is connected, respectively, to a plurality of lead-out wirings 14 disposed on the different mounting sides by using a plurality of FPCs 40.

[Casing]

Furthermore, it is preferable that the organic EL element module where the external equipment is connected is used as a cased light-emitting module product.

FIGS. 23 to 24, FIGS. 25 and 26 show the configuration of the cased organic EL element module (light-emitting module part).

Figure 23:
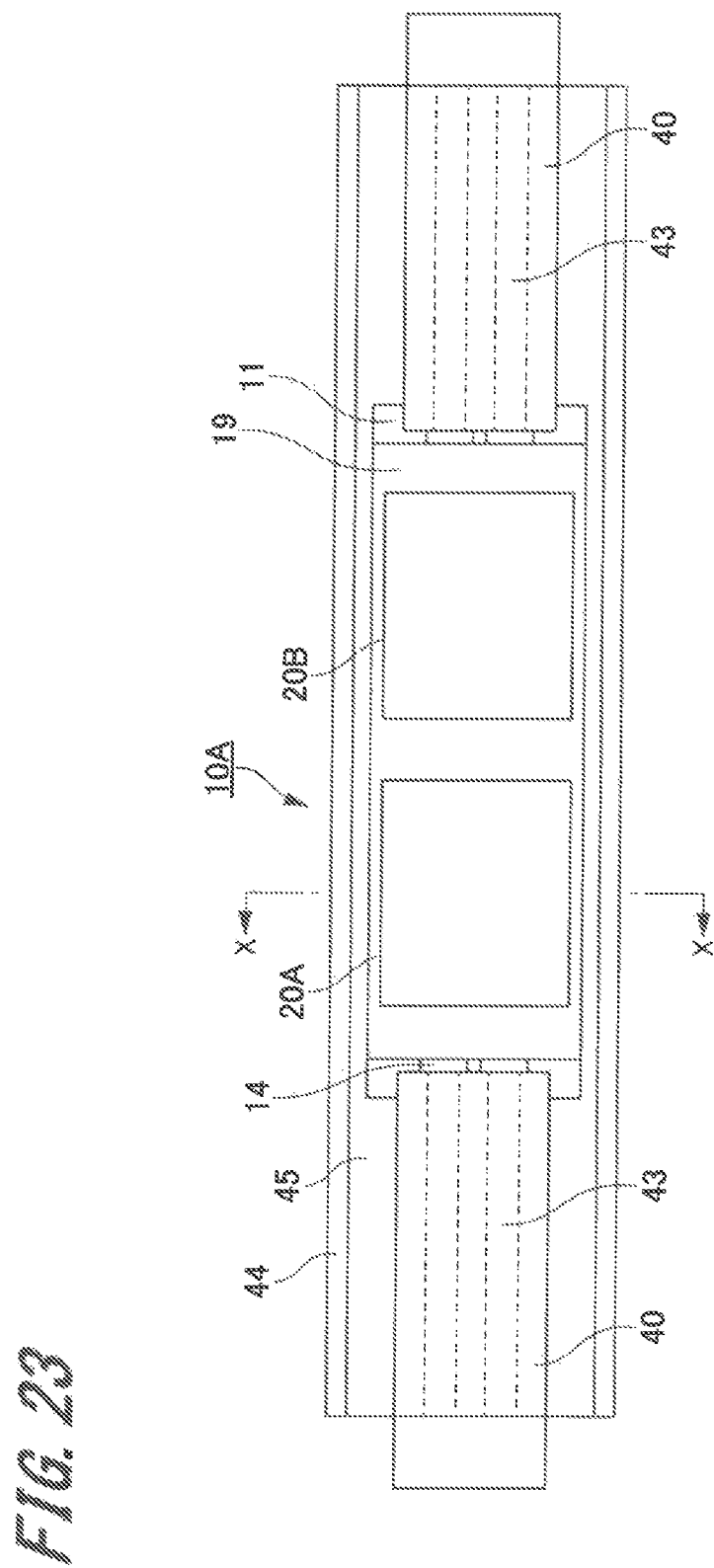
FIG. 23 is a plane arrangement view showing a configuration of the organic EL element module which is installed in a casing.

FIG. 23 is a plane arrangement view showing a configuration of the organic EL element module in a state where the organic EL element 10A is cased.

Figure 24:
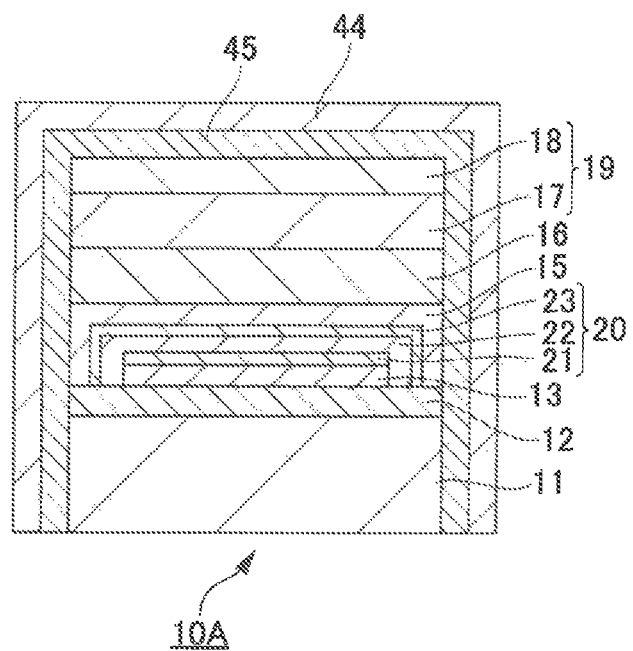
FIG. 24 is a diagram showing a configuration of the organic EL element module which is cased.

FIG. 24 corresponds to an X-X line cross-sectional view of the organic EL element module shown in FIG. 23, and shows a configuration in which the organic EL element module is cased by a metal frame 44 disposed on each surface except for the mounting side to which the FPC 40 is connected.

Figure 25:
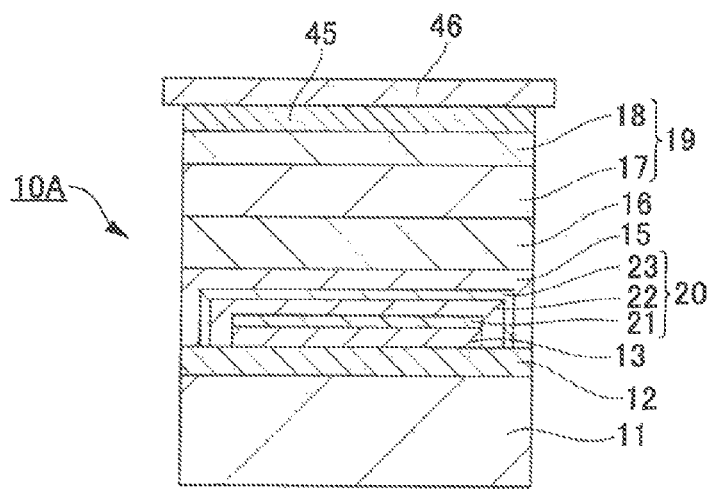
FIG. 25 is a diagram showing a configuration of the organic EL element module which is cased.

FIG. 25 corresponds to an X-X line cross-sectional view of the organic EL element module shown in FIG. 23, and shows a configuration in which the organic EL element module is cased by a metal plate 46 disposed on the sealing substrate 19.

Figure 26:
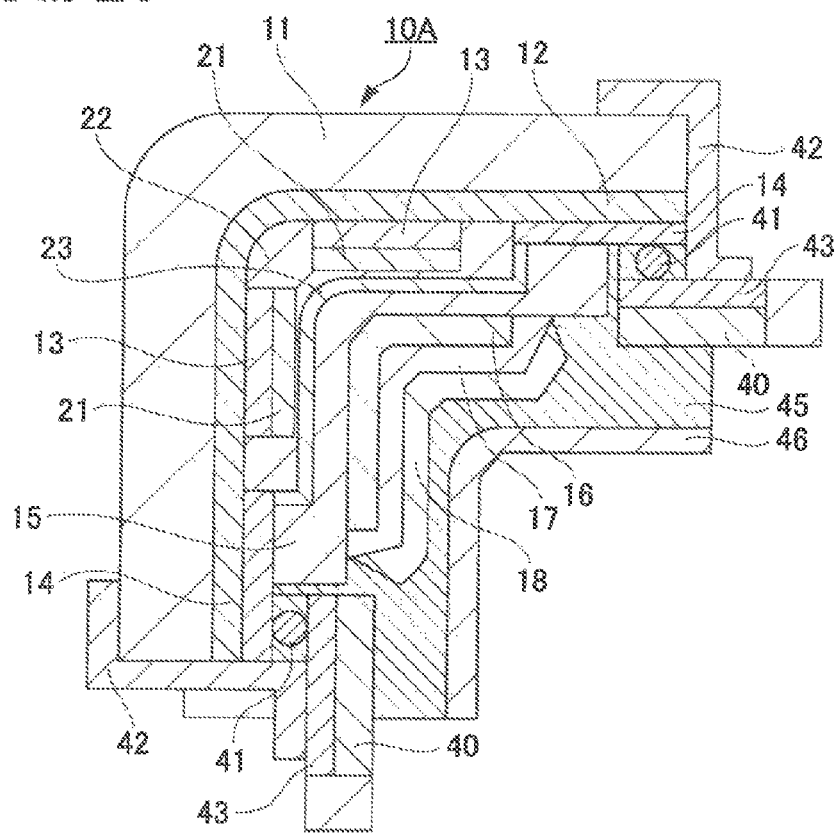
FIG. 26 is a diagram showing a configuration of the organic EL element module which is cased.

FIG. 26 shows a configuration in which the organic EL element module shown in FIG. 25 is in a state of being bendingly maintained with the substrate 11 on the outside (convex side).

In the organic EL element module shown in FIGS. 23 and 24, an adhesive resin 45 for fixing is disposed all over the module excepting the substrate 11 surface (back side surface). In addition, the metal frame 44 is joined to the organic EL element module by the adhesive resin 45.

The adhesive rein 45 is formed around the mounting portion of the organic EL element module and the FPC 40, and also is formed on the FPC 40 side from the connection portion of the organic EL element 10A and the FPC 40. Furthermore, the metal frame 44 is not disposed on the side of the mounting side of the organic EL element 10A, but is disposed on the surfaces other than the mounting side of the organic EL element 10A, and on the sealing substrate 19.

In the organic EL element module shown in FIG. 25, the adhesive resin 45 for fixing is disposed only on the sealing substrate 19. Then, the metal plate 46 is joined to the organic EL element module only on the sealing substrate 19, and the organic EL element module is cased. Accordingly, the adhesive resin 45 and the metal plate 46 are not disposed on the substrate 11 surface (back surface) of the organic EL element and each side surface including the mounting side.

In the organic EL element module shown in FIG. 26, the adhesive resin 45 and the metal plate 46 are disposed only on the sealing substrate 19 in the same way as in the organic EL element module shown in FIG. 25. In addition, the organic EL element module cased in this way is in a state of being bendingly maintained with the substrate 11 on the outside (convex side).

As explained above, the organic EL element 10A can also be in a state of being bendingly maintained.

EXAMPLE

Hereinafter, the present invention will be specifically explained with reference to the examples, but is not limited thereto.

<Production of Organic EL Element>

The respective organic EL element modules of Samples 101 to 109 were produced. Hereinafter, the configurations and production procedures of the organic EL element modules of Samples 101 to 109 are shown.

[Production of organic EL element of Sample 101]

First, there was produced, on a continuous substrate 11, a plurality of organic EL elements 10 obtained by forming the gas barrier layer 12, the base layer 13, the light-emitting part 20 and the lead-out wiring 14, so as to have a configuration shown in FIGS. 1 to 3 and FIG. 15 according to the known method.

Next, a silicon nitride film (SiN, Vickers hardness HV900) having a thickness of 200 nm was formed by a plasma CVD method, as the inorganic sealing layer 15 covering the light-emitting part 20.

In addition, as shown in FIGS. 7 to 9, the resin adhesive layer 16 made of an epoxy-based thermosetting adhesive having a thickness of 20 μm was formed by coating on the sealing substrate 19 composed of the insulation layer 18 (PET film 25 pm) and the metal layer 17 (aluminum foil 30 μm, Vickers hardness HV50) each having the same area so that only the lead-out wiring 14 side (mounting side) was smaller by about 0.1 mm. Then, through the use of the sealing substrate 19, the first pressure-bonding process was carried out under a reduced pressure atmosphere of 1000 Pa and under the conditions of: 70° C. heating rolls, a pressure of 0.2 MPa, and a feeding speed of 0.1 m/min to thereby cause the resin adhesive layer 16 to adhere onto the inorganic sealing layer 15. Furthermore, the second pressure-bonding process was carried out under the conditions of: 90° C. heating rolls, a pressure of 0.5 MPa, and a feeding speed of 0.1 m/min to thereby bend the edge of the sealing substrate 19.

Then, the organic EL element of Sample 101 was manufactured by thermally curing the resin adhesive layer 16.

Subsequently, the organic EL element 10 was cut to an individual piece as shown in FIG. 15 by using a guillotine cutter with a straight super hard blade having a taper angle of 20 degrees.

Moreover, as shown in FIG. 17 and FIG. 18, the FPC 40 was mounted to the lead-out wiring 14 of the organic EL element 10 via the ACF 41.

As a result of the above processes, the organic EL element module of Sample 101 was produced.

[Production of Organic EL Element of Sample 102]

The organic EL element module of Sample 102 was produced in the same way as in the above Sample 101, except that, as shown in FIGS. 10 to 12, the metal layer 17 and the resin adhesive layer 16 were formed so as to be small by about 0.05 mm each from the insulation layer 18 and the resin adhesive layer 16, respectively, only at the lead-out wiring 14 side (mounting side).

The sealing substrate 19 and the resin adhesive layer 16 were formed in the following way.

First, a laminated body of the insulation layer 18 (PET film, 25 μm), the metal layer 17 (aluminum foil 30 μm, Vickers hardness HV50) and the resin adhesive layer 16 (epoxy-based thermosetting adhesive sheet, a film thickness of 20 μm) was formed. Then, the laminated body was cut as a bundle by operating a roll blade having a taper angle of 45 degrees, from the resin adhesive layer 16 side. Accordingly, the sealing substrate 19 was manufactured by cutting the metal layer 17 and the resin adhesive layer 16 so as to be small by about 0.05 mm each from the insulation layer 18 and the resin adhesive layer 16, respectively.

[Production of Organic EL Element of Sample 103]

First, there was produced, on a continuous substrate 11, a plurality of organic EL elements 10 A obtained by forming the gas barrier layer 12, the base layer 13, the light-emitting parts 20A and 20B, and the lead-out wiring 14, so as to have a configuration shown in FIGS. 4 to 6 and FIG. 16 according to the known method. Then, in the same way as in Sample 101, the steps from the formation of the inorganic sealing layer 15 to the cutting of the organic EL element 10A into the individual pieces were carried out.

Subsequently, as shown in FIGS. 19 and 20, the FPC 40 is connected to the lead-out wiring 14 disposed on one edge from one direction side of the organic EL element 10A, extends to the other edge along the sealing substrate 19, and then is connected to the lead-out wiring 14 at the other end.

Except for these procedures, the organic EL element of Sample 103 was produced in the same processes as in the above Sample 101.

[Production of Organic EL Element of Sample 104]

The organic EL element module of Sample 104 was produced in the same processes as in the above Sample 101, except that the inorganic sealing layer 15 of a silicon oxide nitride film (SiON, Vickers hardness HV700) having a film thickness of 200 nm was formed by an ion plating method.

[Production of Organic EL Element of Sample 105]

The organic EL element module of Sample 105 was produced in the same processes as in the above Sample 101, except that the inorganic sealing layer 15 of a silicon oxide nitride film (SiON, Vickers hardness HV450) having a film thickness of 200 nm was formed by a vacuum deposition method.

[Production of Organic EL Element of Sample 106]

The organic EL element module of Sample 106 was produced in the same processes as in the above Sample 101 except that, in the process for joining the sealing substrate 19, the laminated body was cut as a bundle by operating a roll blade having a taper angle of 45 degrees from the insulation layer 18 side, then the metal layer 17 and the resin adhesive layer 16 were cut so as to be large by about 0.05 mm each only at the lead-out wiring 14 side (mounting side) from the insulation layer 18 and the resin adhesive layer 16, respectively, and the edge of the sealing substrate 19 was not folded in the second pressure-bonding process.

Since the formation area of the resin adhesive layer 16 is larger than the sealing substrate 19, Sample 106 is configured to have a portion where the resin adhesive layer 16 is exposed between the sealing substrate 19 on the lead-out wiring 14 and the inorganic sealing layer 15 after the second pressure-bonding process.

[Production of Organic EL Element of Sample 107]

The organic EL element module of Sample 107 was produced in the same processes as in the above Sample 101 except that the inorganic sealing layer 15 of a calcium fluoride film (CaF, Vickers hardness HV200) having a film thickness of 200 nm was formed by a vacuum deposition method.

[Production of Organic EL Element of Sample 108]

The organic EL element module of Sample 108 was produced in the same processes as in the above Sample 101 except that the inorganic sealing layer 15 of a silicon oxide film (SiO, Vickers hardness HV450) having a film thickness of 100 nm was formed by a vacuum deposition method.

[Production of Organic EL Element of Sample 109]

The organic EL element module of Sample 109 was produced in the same processes as in the above Sample 101 except that the inorganic sealing layer 15 was not disposed.

[Evaluation]

An initial lighting test, and a lighting test after being allowed to stand under the circumstances of 85° C. and 85% RH for 500 hours were performed in terms of with the organic EL element modules corresponding to thus produced Samples 101 to 109.

The respective evaluation results of the organic EL element modules corresponding to the above Samples 101 to 109 are shown in Table 2.

In addition, in Samples 107 to 108, since the inorganic sealing layer was partially damaged, the organic EL element module was not lighted due to penetration of water or the like from the damaged portion, after the test at 85° C., 85% RH for 500 hours.

Note that the present invention is not limited to the configurations described in the above exemplary embodiments, and additionally, various modifications and changes are possible within the scope not departing from the configurations of the present invention.

REFERENCE SIGNS LIST 10, 10A Organic EL element
11 Substrate

TABLE 2

|  | Inorganic sealing layer | Area of sealing substrate | Results Initial | After being allowed to stand at 85° C., 85% RH for 500 h | |
|---|---|---|---|---|---|
| 101 | SiN 200 nm | Insulation layer = Metal layer > Resin adhesive layer | ○Lighting | ○Lighting | Present invention |
| 102 | ↑ | Insulation layer > Metal layer > Resin adhesive layer | ○Lighting | ○Lighting | Present invention |
| 103 | ↑ | Insulation layer = Metal layer > Resin adhesive layer | ○Lighting | ○Lighting | Present invention |
| 104 | SiON 200 nm | ↑ | ○Lighting | ○Lighting | Present invention |
| 105 | SiO 200 nm | ↑ | ○Lighting | ○Lighting | Present invention |
| 106 | SiN 200 nm | Insulation layer < Metal layer < Resin adhesive layer | X FPC connection failure Degradation of resin adhesive layer | — | Comparative |
| 107 | CaF 200 nm | Insulation layer = Metal layer > Resin adhesive layer | ○Lighting | X Non-lighting | Present invention |
| 108 | SiO 100 nm | ↑ | ○Lighting | X Non-lighting | Present invention |
| 109 | None | ↑ | X Non-lighting | — | Comparative |

Since Samples 101 to 105 have the configuration in which the light-emitting part is sealed by the inorganic sealing layer and the gas barrier layer, and furthermore, since the resin adhesive layer is configured to be not exposed to the mounting side by the sealing substrate whose edge is folded, the electrical connection between the FPC and the lead-out wiring was performed well, the light emission states of all organic EL element modles were confirmed, and the lighting condition was maintained even after the moisture resistance test.

In contrast, as to Sample 106 which has the resin adhesive layer having a formation area larger than the sealing substrate, since the resin adhesive layer protruded on the lead-out wiring to generate connection failure between the organic EL element and the FPC, the electric connection between the FPC and the lead-out wiring was blocked, and thus the organic EL element module was not lighted.

In addition, since Sample 109 had no inorganic sealing layer, electric short circuit between the lead-out wiring and the metal layer of the sealing substrate was generated, and thus the organic EL element module was not lighted.

Furthermore, since Samples 107 to 108 were provirded with the inorganic sealing layer, the light emission of the organic EL element module was confirmed in the initial stage. However, in Samples 107 to 108, sufficient light emission with respect to the applied current was not obtained in comparison with Samples 101 to 105. It is considered that this is because, due to the low Vickers hardness of the inorganic sealing layer in Sample 107, and due to the small thickness of the inorganic sealing layer in Sample 108, the inorganic sealing layer was partially damaged by pressing of the sealing substrate, the metal layer came close to the lead-out wiring, and thus a part of the applied current was leaked to the metal layer.

12 Gas barrier layer
13 Base layer
14 Lead-out wiring
15 Inorganic sealing layer
16 Resin adhesive layer
17 Metal layer
18 Insulation layer
19 Sealing substrate
20 Light-emitting part
20A First light-emitting part
20B Second light-emitting part
21 First electrode
22 Organic functional layer
23 Second electrode
30 Roll laminating machine
31 First crimp rolls
32 Second crimp rolls
33 Separator
34 Cutting line
40 Flexible print circuit film (FPC)
41 Anisotropically conductive film (ACF)
42 Reinforcing tape
43 Metal wiring
44 Metal frame
45 Adhesive resin
46 Metal plate

The invention claimed is:
1. An organic electroluminescent element comprising:
a substrate;
a gas barrier layer disposed on the substrate;
a light-emitting part disposed on the gas barrier layer and comprising a first electrode, an organic functional layer, and a second electrode;

an inorganic sealing layer which covers the light-emitting part;

lead-out wiring that extends outside the inorganic sealing layer and is connected with the first electrode or the second electrode; and a sealing substrate including a metal layer and an electrical insulation layer which are bonded together via a resin adhesive layer on the inorganic sealing layer, wherein, above at least the lead-out wiring, the sealing substrate is folded to the substrate side, and at least any one of the metal layer and the insulation layer makes contact with the inorganic sealing layer.

2. The organic electroluminescent element according to claim 1, wherein, in the sealing substrate, a thickness of the insulation layer is smaller than that of the metal layer.

3. The organic electroluminescent element according to claim 1, wherein a surface hardness of the inorganic sealing layer is 400 HV or more in terms of Vickers hardness.

4. The organic electroluminescent element according to claim 1, wherein a thickness at the thinnest portion of the inorganic sealing layer is 200 nm or more.

5. The organic electroluminescent element according to claim 1, wherein the resin adhesive layer is formed so as to have an area smaller than that of the metal layer.

6. The organic electroluminescent element according to claim 1, wherein the sealing substrate makes contact with an upper surface of an external edge portion of the inorganic sealing layer.

7. The organic electroluminescent element according to claim 1, wherein external equipment is connected to the lead-out wiring which is led out outside the inorganic sealing layer.

8. A method for producing an organic electroluminescent element, the method comprising the steps of:

forming a gas barrier layer on a substrate;

forming a light-emitting part including a first electrode, an organic functional layer, and a second electrode, on the gas barrier layer;

forming lead-out wiring which is connected to the first electrode or the second electrode;

forming an inorganic sealing layer which covers the light-emitting part and a part of the lead-out wiring on the light-emitting part side;

pressure-bonding a sealing substrate by joining the sealing substrate including a metal layer and an insulation layer which are bonded together via a resin adhesive layer on the inorganic sealing layer, and by folding at least an edge portion of the sealing substrate above the lead-out wiring so that at least any one of the metal layer and the insulation layer makes contact with the inorganic sealing layer.

9. The method for producing an organic electroluminescent element according to claim 8, wherein the pressure-bonding step of the sealing substrate is conducted under a reduced pressure atmosphere.

10. The method for producing an organic electroluminescent element according to claim 8, wherein the pressure-bonding step of the sealing substrate is conducted by supplying the substrate and the sealing substrate in a roll state.

11. The method for producing an organic electroluminescent element according to claim 8, wherein the pressure-bonding step of the sealing substrate includes a first pressure-bonding step of bringing the resin adhesive layer into contact with the surface of the inorganic sealing layer, and a second pressure-bonding step of folding the edge portion of the sealing substrate.

* * * * *